US008786481B1

(12) United States Patent
Tzeng

(10) Patent No.: US 8,786,481 B1
(45) Date of Patent: Jul. 22, 2014

(54) METHOD AND APPARATUS FOR EVENT DETECTION AND ADAPTIVE SYSTEM POWER REDUCTION USING ANALOG COMPRESSION ENGINE

(71) Applicant: Zerowatt Technologies, Inc., Aliso Viejo, CA (US)

(72) Inventor: Fred Taching Tzeng, Laguna Nigel, CA (US)

(73) Assignee: Zerowatt Technologies, Inc., Aliso Viejo, CA (US)

( * ) Notice: Subject to any disclaimer, the term of this patent is extended or adjusted under 35 U.S.C. 154(b) by 0 days.

(21) Appl. No.: 13/667,350

(22) Filed: Nov. 2, 2012

Related U.S. Application Data

(60) Provisional application No. 61/556,498, filed on Nov. 7, 2011, provisional application No. 61/594,215, filed on Feb. 2, 2012.

(51) Int. Cl.
*H03M 1/12* (2006.01)
(52) U.S. Cl.
USPC .......................................... 341/155; 341/118
(58) Field of Classification Search
USPC .......................................... 341/155, 143, 118
See application file for complete search history.

(56) References Cited

U.S. PATENT DOCUMENTS

| 7,193,545 | B2 * | 3/2007 | Morrow et al. | 341/143 |
| 7,714,757 | B2 * | 5/2010 | Denison et al. | 341/143 |
| 8,097,853 | B2 * | 1/2012 | Ji et al. | 250/340 |
| 8,212,942 | B2 * | 7/2012 | Gu et al. | 348/726 |

* cited by examiner

*Primary Examiner* — Brian Young
(74) *Attorney, Agent, or Firm* — Knobbe, Martens, Olson & Bear, LLP

(57) ABSTRACT

The disclosed invention provides for power reduction of electronic building blocks based on the activity of analog signals, or analog signals that have been digitized by a analog-to-digital signal. In some implementations, an event detection engine classifies whether an event has occurred in the signal at a particular time, based on amplitude, frequency, patterns, and/or statistical information. Such information on the signal can be set by the designer of the electronic system, or it could be autonomously set by a central unit, such as a processor. By analyzing and detecting events within the signal based on multi-dimensional parameters, the other building blocks, such as a processor or radio or analog front end, can be put in low power sleep mode much longer compared to traditional methods.

18 Claims, 26 Drawing Sheets

METHOD AND APPARATUS FOR EVENT DETECTION AND ADAPTIVE SYSTEM POWER REDUCTION USING ANALOG COMPRESSION ENGINE

RELATED APPLICATIONS

This disclosure claims priority to U.S. Provisional Application No. 61/556,498 filed Nov. 7, 2011 and entitled "METHOD AND APPARATUS FOR ADAPTIVE ANALOG COMPRESSION", and to U.S. Provisional Application No. 61/594,215 filed Feb. 2, 2012 and entitled "METHOD AND APPARATUS FOR EVENT DETECTION AND SYSTEM POWER REDUCTION USING ANALOG COMPRESSION ENGINE," each of which are expressly incorporated by reference herein in their entirety.

BACKGROUND

Low power consumption is increasingly important in electronic systems. It is desirable to keep many blocks of the electronic system in sleep mode, where active power is very low, as long and as often as possible. Typical methods in doing so are to wake up blocks, such as the processor or radio, on a set interval determined by a clock or timer. Another well-known method is to wake up blocks when the signal to be processed exceeds a certain voltage threshold. These methods, however, cannot wake up the electronic blocks very selectively due to its simplicity or due to it being restricted by a predetermined time interval.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Figure 1:
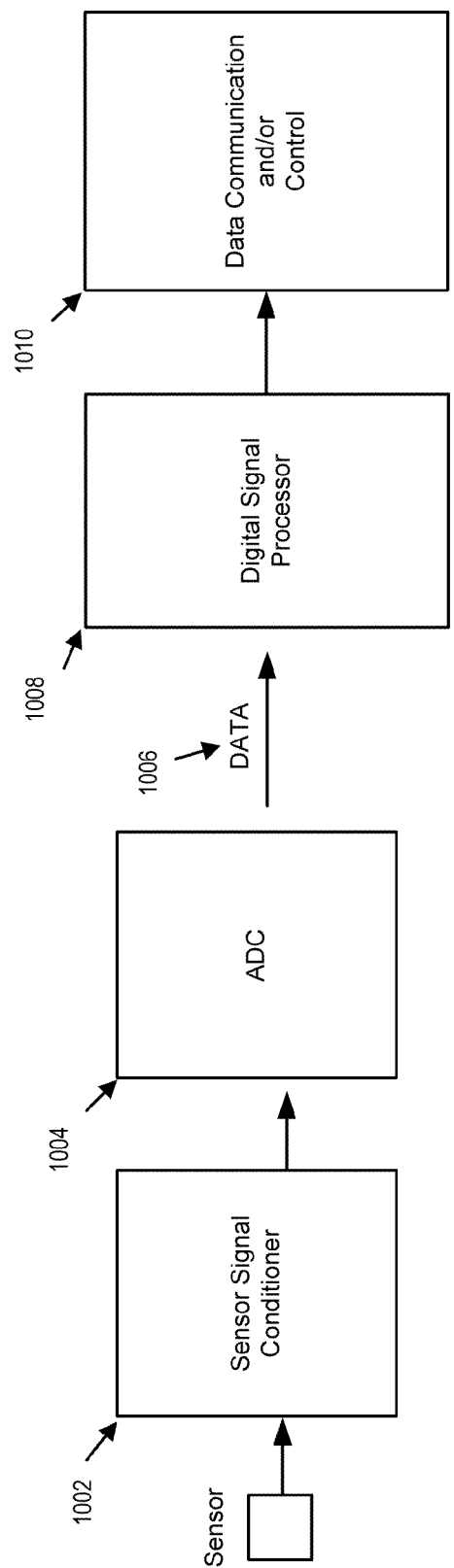
FIG. 1 illustrates an example of a sensor signal chain for a system that includes an Analog to Digital Convertor (ADC).

FIG. 1 illustrates an example of a sensor signal chain for a system that includes an Analog to Digital Convertor (ADC) 1004. In this example, the input of the ADC 1004 is coupled to the output of a sensor signal conditioner 1002. The ADC 1004 is configured to digitize an analog signal received at the input to the ADC 1004 and to provide a digitized signal 1006 to the input of the subsequent digital signal processor (DSP) 1008. The DSP 1008 can take a variety of forms, including, but not limited to, a microcontroller, a Field Programmable Gate Array (FPGA), a microprocessor, or a custom DSP. The sampling clock for the ADC 1004 can be provided by an external source or generated by the DSP 1008. Typically, many pre-existing ADCs operate in a mode that consumes a constant maximum level or amount of power, regardless of how the input signal may change over time. ADCs typically operate at maximum power in an attempt to avoid degrading a signal's quality during the signal's highest peaks and fastest transitions. Also, many pre-existing ADCs are limited in that they provide only a digitized signal to a DSP without providing power management, program interruption, clock control, and or other control signals to the DSP. As a result, the control of the power consumption and operating load of the DSP is left primarily to the DSP or an external device. Furthermore, because the ADC does not provide control signals to the DSP, devices that may be subsequent to the DSP, such as a communications link or a user interface (e.g., the user interface 1010), cannot benefit from the information provided by the control signals of pre-existing ADCs.

Figure 2:
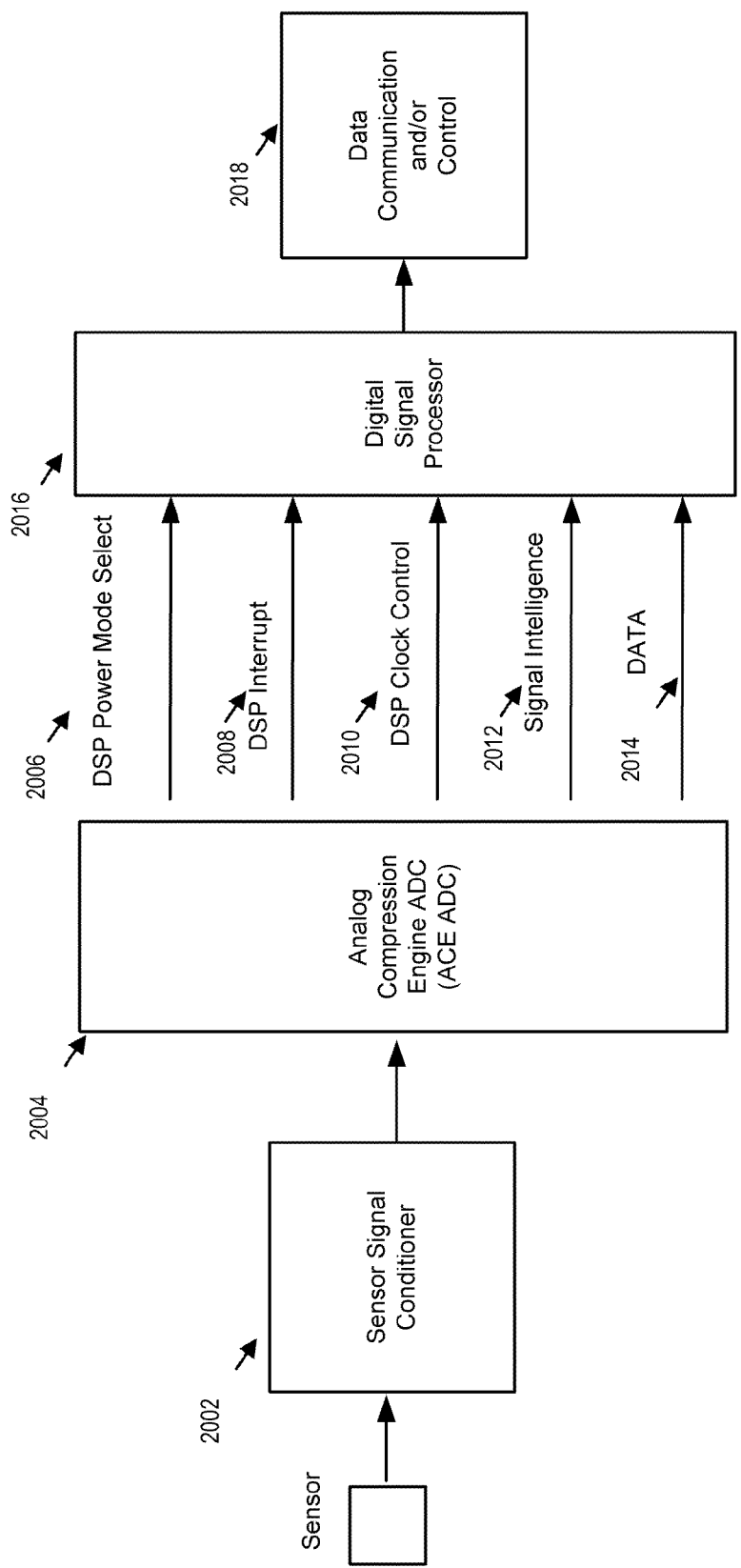
FIG. 2 illustrates an example of a sensor signal chain for a system that includes an ADC with an Analog Compression Engine (ACE) in accordance with embodiments of the present disclosure.

FIG. 2 illustrates an example of a sensor signal chain for a system that includes an ADC with an Analog Compression Engine (ACE) (e.g., the ACE ADC 2004) in accordance with embodiments of the present disclosure. Additional embodiments of the ACE and the ACE ADC that may be used in embodiments of the present disclosure are described in U.S. patent application Ser. No. 13/210,991 filed on Aug. 16, 2011 and titled "SIGNAL STATISTICS AND COMPRESSION-BASED ANALOG-TO-DIGITAL CONVERTERS," which are hereby incorporated by reference in their entirety. The ACE ADC 2004 may be configured to communicate with a sensor signal conditioner 2002 and to receive a conditioned analog signal from the sensor signal conditioner 2002. The sensor signal conditioner 2002 can include any device that is configured to filter, manipulate, adjust, or perform any other conditioning operation on an analog signal.

Further, the ACE ADC 2004 may be configured to perform analog-to-digital conversion of a signal (e.g. the conditioned signal received from the sensor signal conditioner 2002) to obtain a digitized signal. The ACE ADC 2004 can provide the digitized signal and information associated with the signal, conditioned signal, and/or digitized signal, including control signals based on this information, to devices in communication with the ACE ADC 2004, such as the Digital Signal Processor (DSP) 2016. This information can include any data associated with the signal, conditioned signal and/or digitized signal including, for example, the maximum signal amplitude over a period of time, the maximum signal frequency over a period of time, the rate at which the amplitude changes, and how noisy the signal is. Advantageously, in certain embodiments, providing information associated with the signal to the DSP 2016 facilitates optimization of power consumption by enabling the tracking of signal changes over time in individual components as well as the system as a whole.

The ACE ADC 2004 may be configured to provide the digitized signal, data 2014, to the DSP 2016 and additional information about the analog signal obtained by monitoring the analog signal over a period of time. By monitoring the analog signal over a period of time, the ACE ADC 2004 can provide information (e.g., signal intelligence 2012) associated with how the analog signal changes, if at all, over time and can provide control signals based on the signal intelligence 2012. The control lines can include, but are not limited to, DSP power management signals (e.g., power mode select 2006), DSP program interrupts 2008, DSP clock control 2010, and signal intelligence 2012. The information provided via these control lines can be updated as fast as the rate that each analog sample is digitized. Alternatively, the information may be provided at a specific frame rate, with each frame comprising one or more samples. Furthermore, in certain embodiments, each component in communication with the DSP 2016, such as a communications link or user interface 2018, may be configured based on the control signals provided via the control lines (e.g. DSP Power Mode Select 2006) by the ACE ADC 2004.

Figure 3:
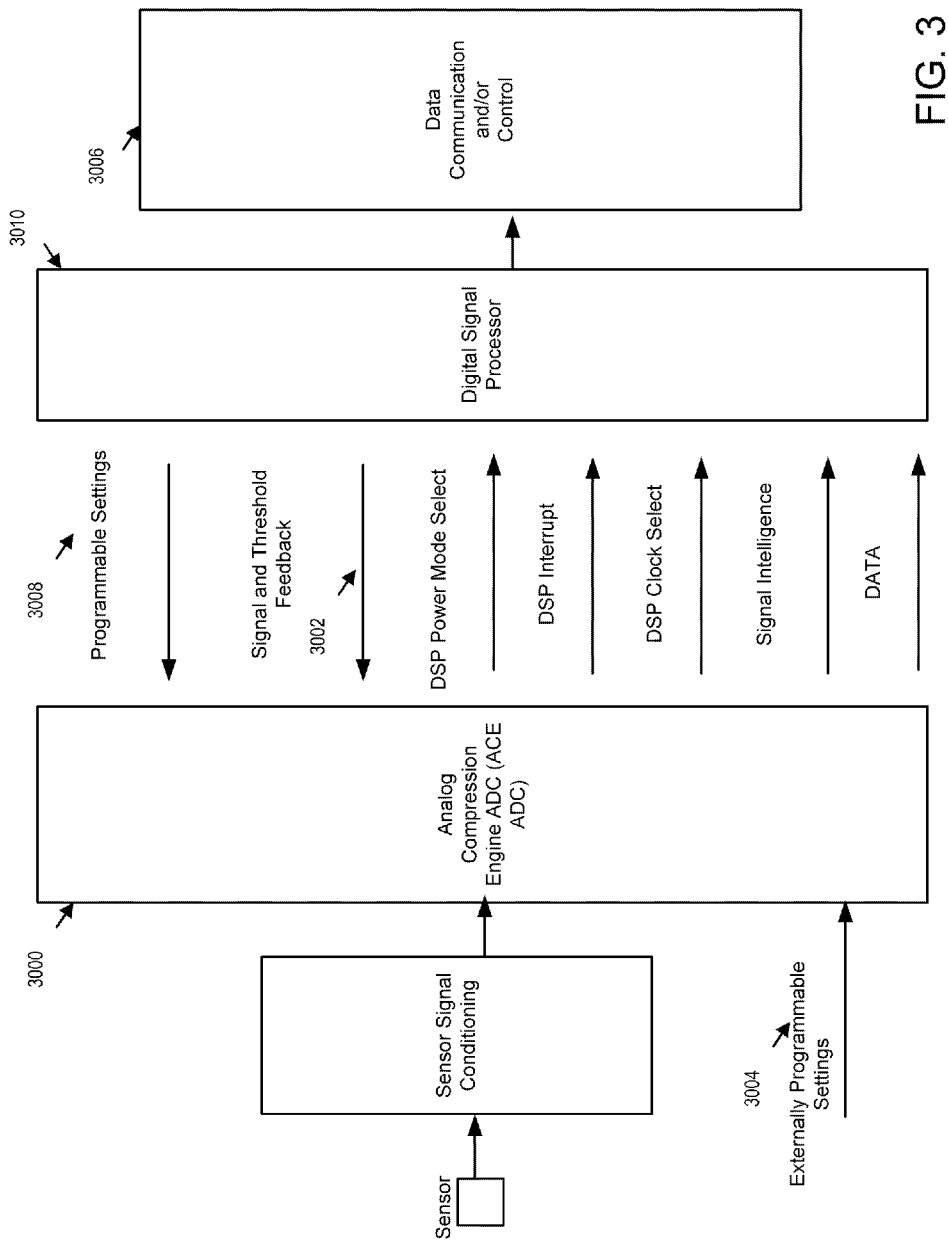
FIG. 3 illustrates an example of a sensor signal chain for a system that includes an ADC with an ACE, which receives feedback signals and programmable configuration settings from a Digital Signal Processor (DSP) in accordance with embodiments of the present disclosure.

FIG. 3 illustrates an example of a sensor signal chain for a system that includes an ADC with an ACE (ACE ADC 3000) that receives feedback signals and programmable configuration settings from a Digital Signal Processor (DSP) 3010 in accordance with embodiments of the present disclosure. These feedback signals may be provided, for example, via a programmable settings 3008 line and a signal and threshold feedback line 3002. Based on one or more of the digitized signal, the information associated with the signal, and the control signals provided by the ACE ADC 3000, the DSP 3010 can monitor whether the analog signal received by the ACE ADC 3000 was processed correctly by the ACE ADC 3000. Determining whether the analog signal was processed correctly can include, but is not limited to, determining whether 1) important signal events (such as when the signal surpasses a certain frequency, amplitude, or variance boundary, or when the signal closely matches an identified pattern, for the application of interest) were correctly identified, 2) whether a false alarm rate falls within a user-defined limit, where false alarms are defined as when the signal at a particular time is identified falsely as an important event when it is actually not, and 3) whether it has missed important events, where important events may include those events identified by item 1) above. Further, important signal events may be application specific and can be determined by a user a priori or during operation. Based upon whether the analog signal was processed correctly, the DSP 3010 can adjust the signal detection and compression parameters of the ACE ADC 3000 to improve the rate of correctly identifying important signal events, keeping false alarm rates within limits, and reducing missed important events.

Additionally, the DSP 3010 can manage the power consumption of the ACE ADC 3000 by adjusting the signal detection and compression parameters of the ACE ADC 3000. Further, in some embodiments, the DSP 3010 can adjust the configuration of the ACE ADC 3000, including, but not limited to, the rate of adaptation, the event detection thresholds, the correlation templates for identifying signals, the speed of operation, and the resolution of the ACE ADC 3000. In some cases, these settings may also be programmed via the externally programmable settings line 3004 through a digital interface, either during factory calibration or during field operation. The ACE ADC 3000 can also provide signal intelligence (e.g. information about the signal) and control signals indirectly, through the DSP 3010, to blocks in communication with the DSP 3006 to optimize the power consumption of the blocks and the system, and the activity level of the blocks and the system based on the analog signal that is to be digitized.

Figure 4:
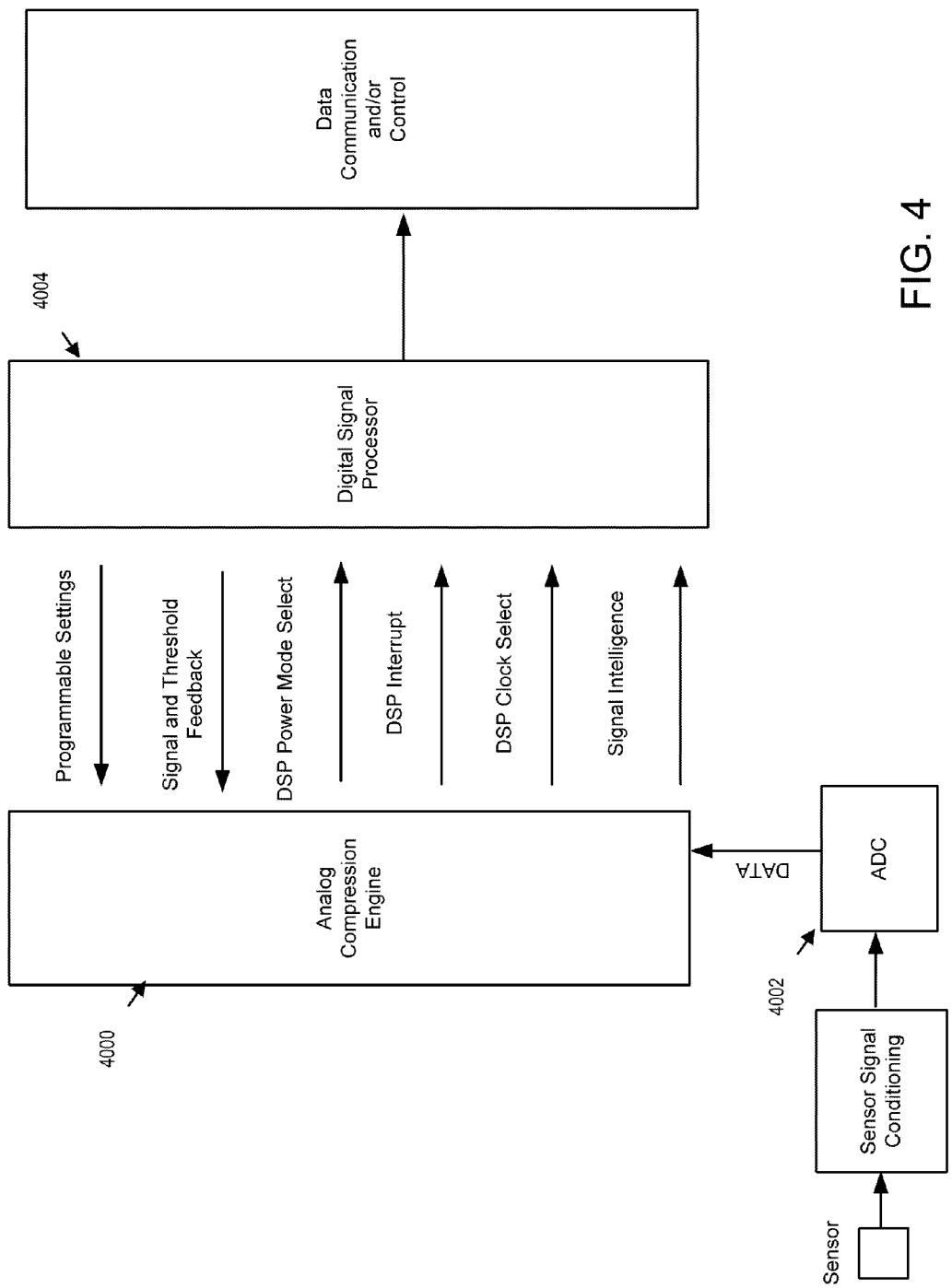
FIG. 4 illustrates an example of an Analog Compression Engine in communication with an ADC and a DSP for a system with a sensor in accordance with embodiments of the present disclosure.

FIG. 4 illustrates an example of an Analog Compression Engine 4000 in communication with an ADC 4002 and a DSP 4004 for a system with a sensor in accordance with embodiments of the present disclosure. In this embodiment, the ACE 4000 may be separate from the ADC 4002. The ACE 4000 may be in communication with both the ADC 4002 and the DSP 4004. The ACE 4000 may receive a data signal from the ADC, analyze and interpret the data signal as described above, and control the DSP 4004 based on the data signal being processed. Thus, the ACE 4000 may be used to optimize the power consumption and the activity of the entire system (including the ADC) without modifying the design of the ADC 4002.

Figure 5:
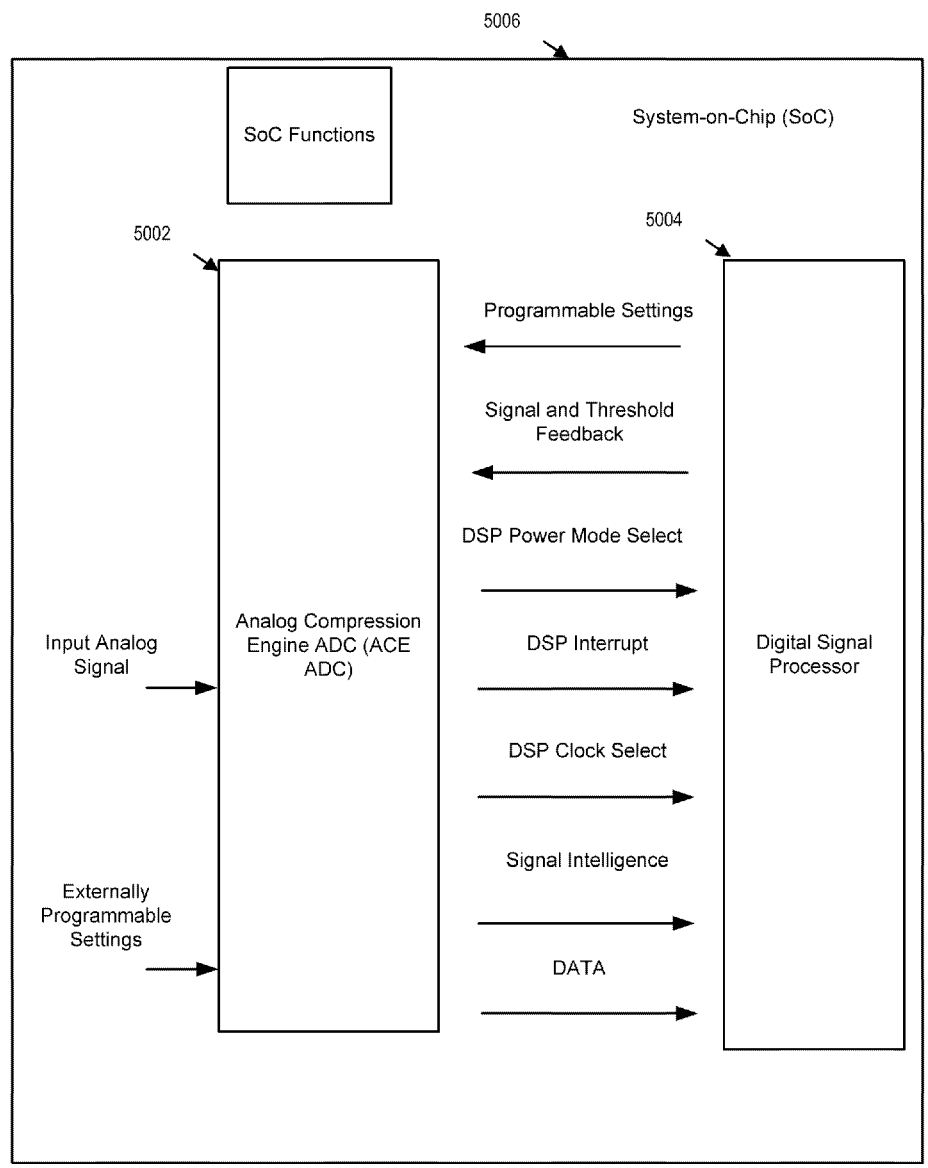
FIG. 5 illustrates an example of a System-on-Chip (SoC) that includes an ACE ADC in accordance with embodiments of the present disclosure.

FIG. 5 illustrates an example of a System-on-Chip (SoC) 5006 that includes an ACE ADC 5002 in accordance with embodiments of the present disclosure. As can be seen in FIG.

5, the ACE ADC 5002 can be integrated as part of a larger chip, such as, but not limited to, a microcontroller. In such embodiments, the output signals of the ACE ADC 5002 may be provided to the DSP 5004, or other components of the system-on-chip 5006.

Figure 6:
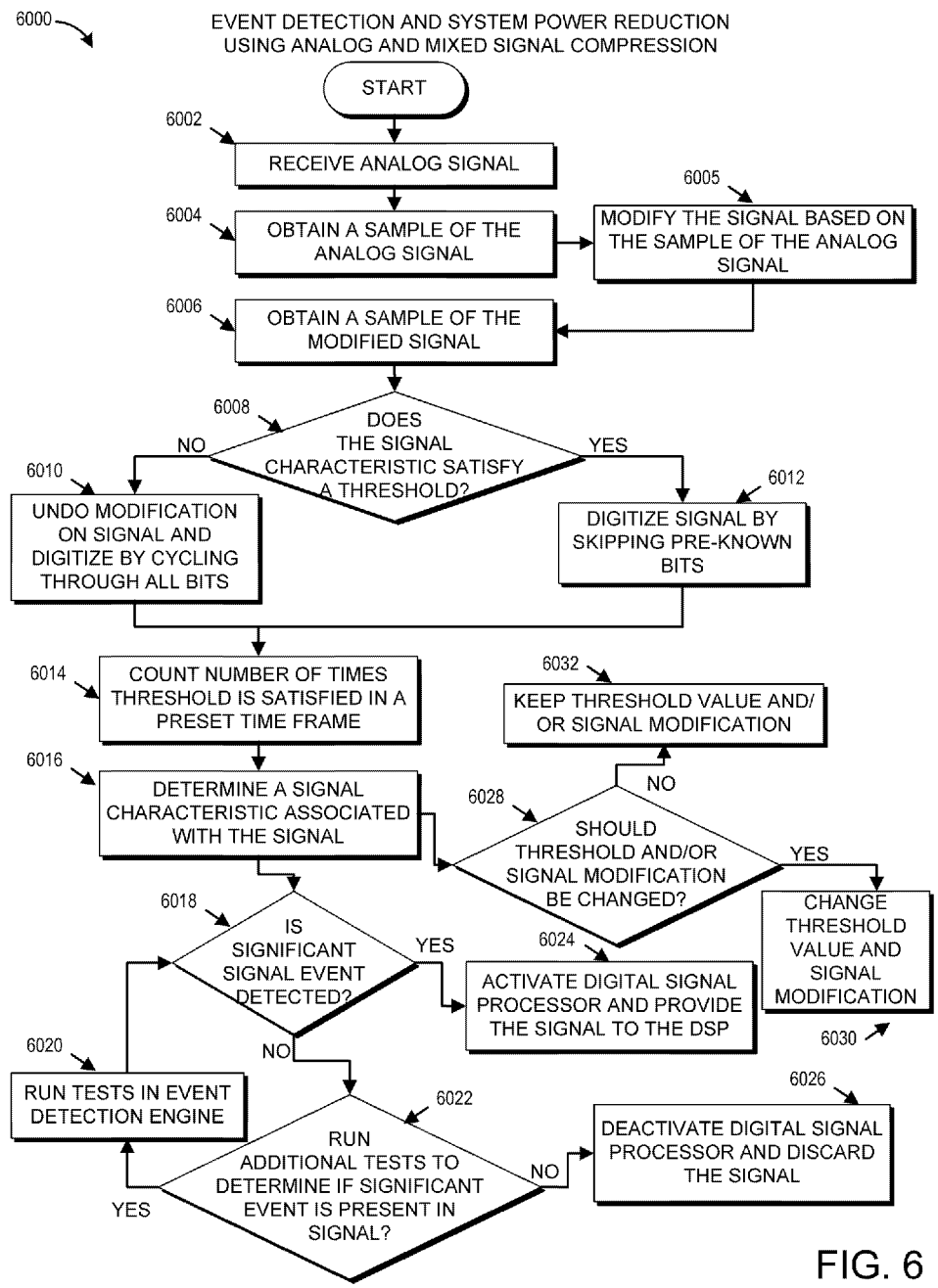
FIG. 6 presents a flowchart for an embodiment of a power reduction technique in accordance with embodiments of the present disclosure.

FIG. 6 presents a flowchart for an embodiment of a power reduction process 6000 in accordance with embodiments of the present disclosure. Process 6000 may be implemented by, for example, an ACE or an ACE ADC (e.g. ACE 4000 or ACE ADC 3000). To simplify discussion, the process 6000 will be described as being performed by a system (e.g. SoC 5006) that includes an ACE or an ACE ADC.

The process 6000 begins at block 6002 where the system receives an analog signal. After receiving the signal, the system obtains a sample of the analog signal at block 6004. The system then modifies the signal based on the sample of the analog signal at block 6005 and obtains a sample of the modified signal at block 6006. At decision block 6008 the system determines, based on the sample of the modified signal, whether a characteristic of the signal satisfies a threshold. This characteristic can include any characteristic associated with a signal including, for example, signal amplitude, signal frequency, and rate of change of signal amplitude and/or frequency.

If the characteristic of the signal satisfies, or is below, the threshold, the sample is quantized at block 6012 using an efficient lossless quantization method that saves power by skipping bits that are "known." These "known" bits may be determined based on knowledge of how the signal is modified at block 6005 and the value of the threshold used at decision block 6008. If the sampled signal does not satisfy, or is above, the threshold, the analog signal is reverted to its pre-modified state and the signal is quantized by cycling through every bit at block 6010. In certain embodiments, some or all of blocks 6004, 6005, 6006, 6008, 6010, and 6012 may be repeated a number of times over a time frame. The purpose of doing so is to redo a different signal modification of 6005 and/or to change the threshold value of 6008, in order to maximize the probability of performing the operation of block 6012 rather than the operation at block 6010, which ultimately leads to better power efficiency during the digitization process.

The number of times the threshold is satisfied over the time frame is counted and determined at block 6014. This number provides frequency and/or amplitude/variance information about the signal, because it tells how often the signal satisfies a known threshold 6008 and known signal modification of 6005. At block 6016, the system determines a number of signal characteristics associated with the unmodified analog signal including, for example, amplitude, variance, frequency, and pattern, and how the statistical history of such parameters vary over time. Based, at least in part, on the signal characteristics, the system determines at decision block 6028 whether to adjust the threshold used at decision block 6008, and/or adjust how the signal is modified in 6005. If so, the system adjusts the threshold at block 6030 otherwise, the system maintains the existing threshold value at block 6032 for repeating the process 6000 with the next frame.

Further, based at least in part on the signal characteristics, the system determines at decision block 6018 whether a significant event is detected. Significant events are defined as, but not limited to, when the signal surpasses a certain frequency, amplitude, or variance boundary, or when the signal closely matches an identified pattern, for the application of interest. If a significant event is detected, the system activates the digital signal processor in communication with the ACE and provides the control signals, such as 2006, 2008, 2010, 2012, 2014, to the DSP at block 6024. If a significant event is not detected, the system determines at decision block 6022, by feedback from the DSP or by pre-determined settings by the user, whether to run additional tests to determine if a significant event is present. Additional tests can include re-modifying the analog signal of 6005, changing the threshold of 6008, or changing definitions of signal characteristics associated with the signal at 6016, such as signal frequency, amplitude, and variance. If not, the system deactivates the DSP and discards the digitized analog signal data at block 6026. In certain embodiments, deactivating the DSP can include providing power management control signals to the DSP, telling it to change its operation mode. In one embodiment, if the system determines at decision block 6022 to run additional tests, the system runs the additional tests using an Event Detection Engine, which is described further with reference to FIG. 7, at block 6020. The system then proceeds to decision block 6018.

Figure 7:
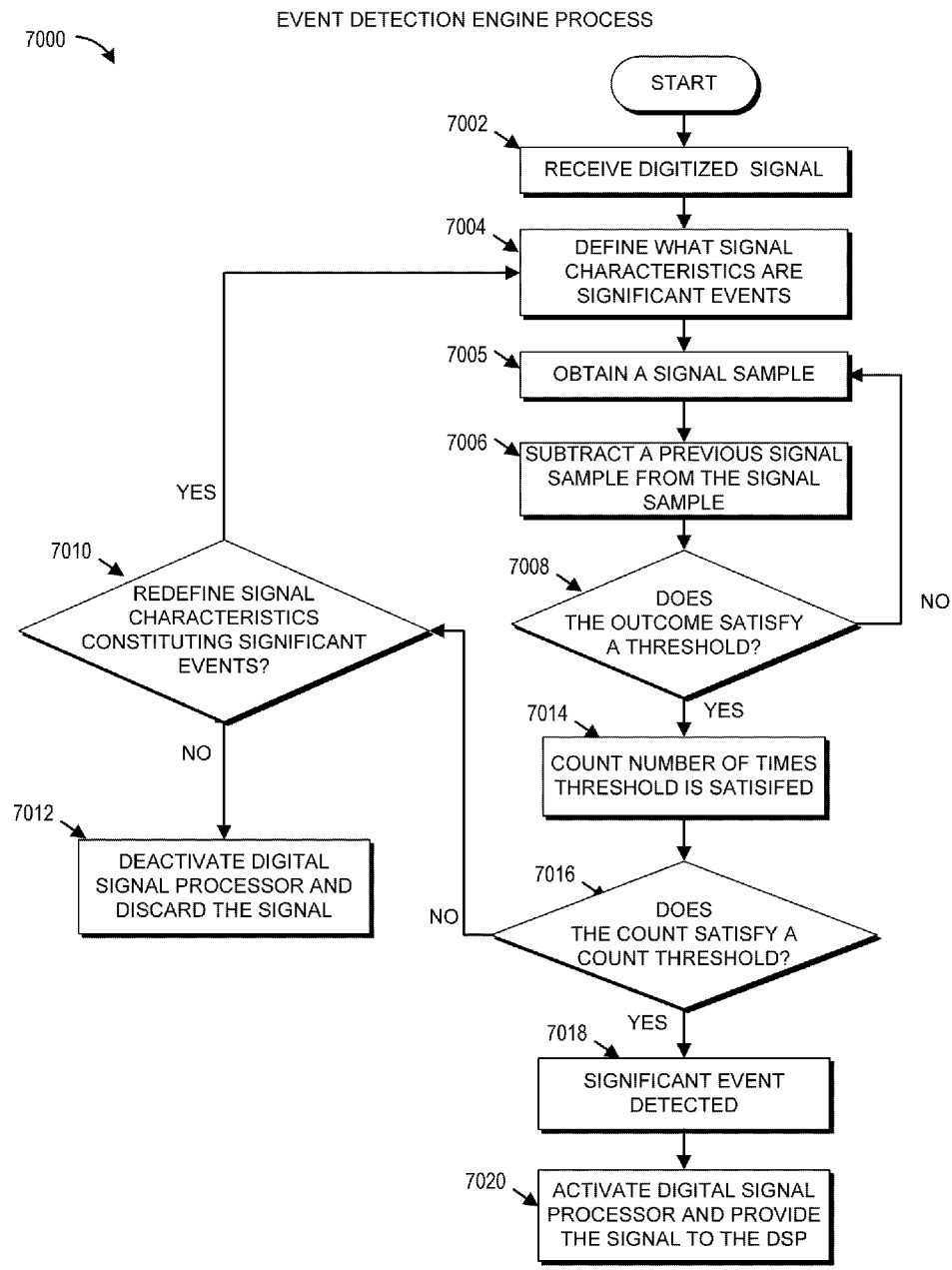
FIG. 7 presents a flowchart for an embodiment of an event detection process in accordance with embodiments of the present disclosure.

FIG. 7 presents a flowchart for an embodiment of an event detection process 7000 in accordance with embodiments of the present disclosure. Process 7000 may be implemented by, for example, an ACE or an ACE ADC (e.g. ACE 4000 or ACE ADC 3000) or an Event Detection Engine, which may be included within an ACE or ACE ADC, or may be a separate block. To simplify discussion, the process 7000 will be described as being performed by a system (e.g. SoC 5006) that includes an ACE, an ACE ADC, and/or an Event Detection Engine.

The process 7000 begins at block 7002 where the system receives a digitized signal. At block 7004, the system defines the signal characteristics that constitute significant events. These characteristics and/or events may be defined by the user, the DSP, or another circuit, based on the signal surpassing a certain frequency, amplitude, or variance boundary, or when the signal closely matches an identified pattern, for the application of interest.

At block 7005, the system obtains a signal sample from the received digitized signal. The system then subtracts a previous signal sample from the signal sample at block 7006. The time position of the previous sample may be determined by a user or based on the signal characteristics to be evaluated. At decision block 7008, the system determines whether the outcome of block 7006 satisfies a threshold. If not, the system obtains the next signal sample at block 7005. If so, the system counts the number of times the threshold has been satisfied within a time frame at block 7014.

At decision block 7016, the system determines if the count determined at block 7014 satisfies a count threshold. If so, the system determines at block 7018 that a significant event has occurred. At block 7020, the system activates the DSP and provides the DSP with the signal. In certain embodiments, activating the DSP can include providing power to the DSP.

If the count determined at block 7014 does not satisfy the count threshold within a time frame, the system has the option at decision block 7010 to redefine the signal characteristics that are significant events. In certain embodiments, decision block 7010 may be optional. This option's availability could be set by the DSP or by the user. If the system determines that the signal characteristics constituting significant events should be redefined, the system proceeds to block 7004. Otherwise, the system determines that a significant event is not present and deactivates the DSP and discards the signal at block 7012. In certain embodiments, deactivating the DSP can include providing a power management control signal to the DSP so as to power off or reduce the DSP's power consumption.

Figure 8:
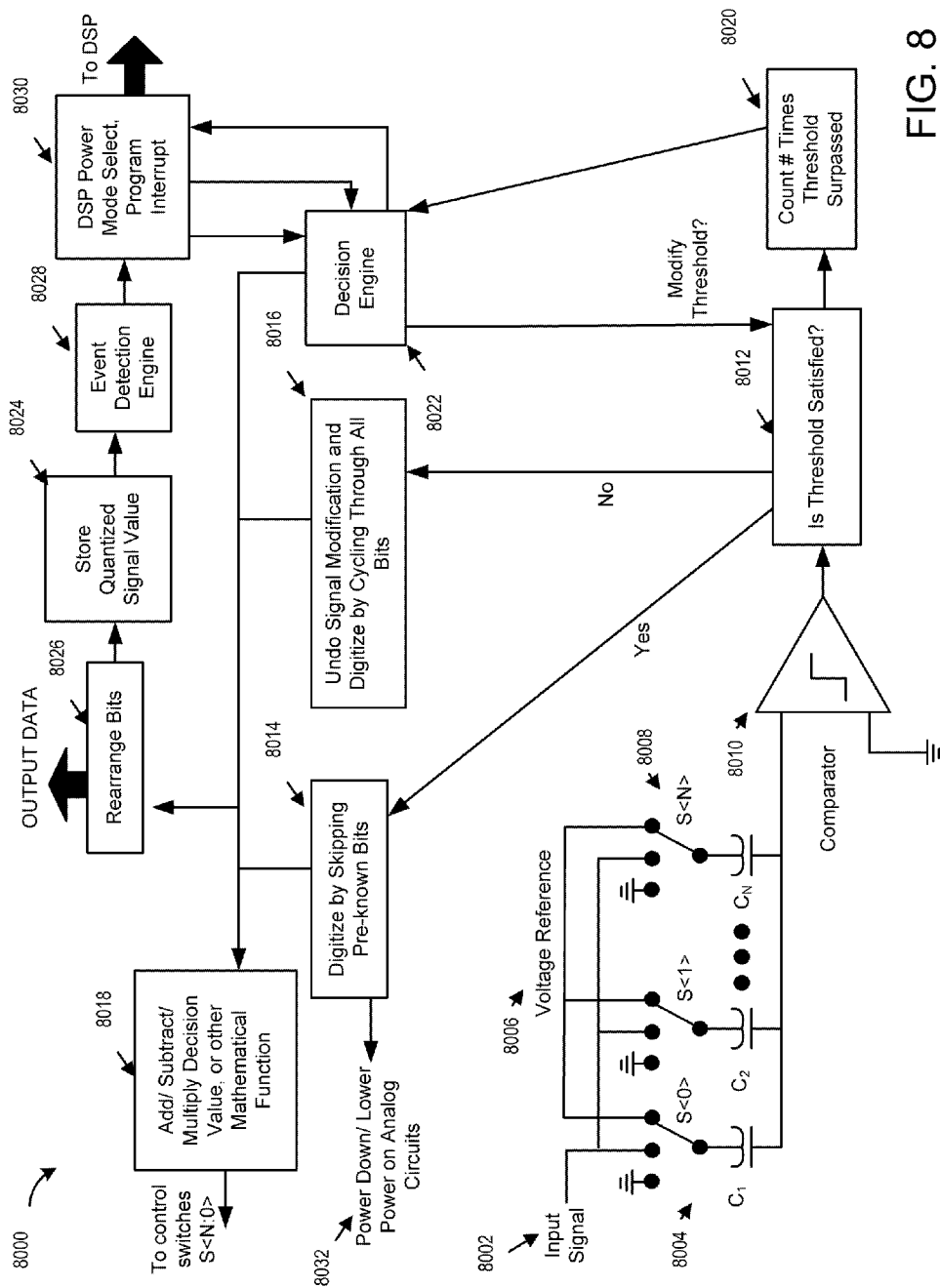
FIG. 8 illustrates an example of an implementation of an ACE ADC in accordance with embodiments of the present disclosure.

FIG. 8 illustrates an example of an implementation of an ACE ADC 8000 in accordance with embodiments of the present disclosure. The input analog signal 8002 is first sampled onto the capacitive digital-to-analog converter (CDAC). Next, the signal is modified by switching the connection to the capacitors 8008 to either a voltage reference 8006 or ground. The modified signal is then compared to a threshold by the comparator 8010. If the outcome of the comparator satisfies a threshold check at block 8012, the ACE ADC is configured to digitize the signal by skipping preknown bits at block 8014. The quantization process finishes early compared to a system that is configured to cycle through all bits during digitization, and thus, when the remaining bits are digitized, the analog blocks can be turned off or have their power reduced 8032, until the next sample arrives. If the threshold is not satisfied, the signal modification in the ADC will be reversed and all bits of the sampled are cycled through during digitization 8016. In either case of 8014 or 8016, the control switches of the CDAC are manipulated to perform addition, subtraction, multiplication, or other mathematical functions 8018. The bits resulting from 8014 or 8016 are rearranged to form the output data 8026.

The number of times the threshold is satisfied within a certain time frame is counted at block 8020. This count is provided to a decision engine 8022. The decision engine, based on the previously stored quantized values 8024 and the count, can adaptively change the type and magnitude of modification of the sampled signal at block 8018. Further, the decision engine can modify the threshold at block 8012 to maximize the probability that a signal is processed by block 8014. Based on the state of the decision engine 8022, information associated with the signal, such as amplitude, frequency, variance, patterns, and statistics, is gathered. Further, based on this gathered information, the ACE ADC 8000 determines whether a significant event is detected and whether the DSP should be activated or deactivated (e.g., powered or not powered). In some embodiments, the event detection engine 8028 helps determine whether a significant event is detected. The ACE ADC 8000 can also determine whether to interrupt a program executed by the digital signal processor. The event detection engine 8028 can facilitate determining whether the signal includes a significant event. The event detection engine is described further with respect to FIG. 9.

Figure 9:
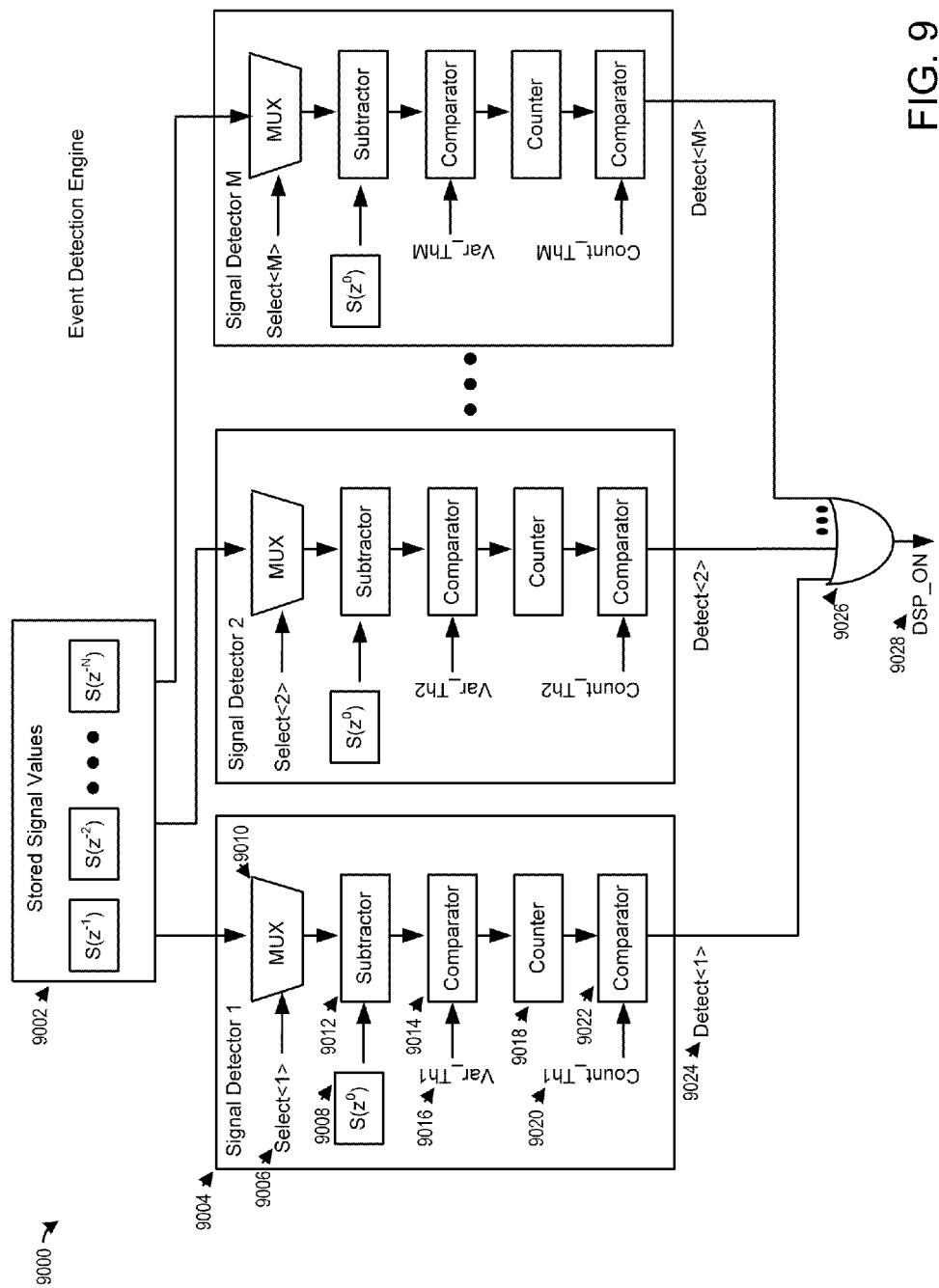
FIG. 9 illustrates an example of an implementation of an event detection engine in accordance with embodiments of the present disclosure.

FIG. 9 illustrates an example of an implementation of an event detection engine 9000 in accordance with embodiments of the present disclosure. The event detection engine 9000 is capable of storing N digitized values of signal samples at block 9002. These signal samples can be success over a time period. Further, the event detection engine 9000 can include M signal detector modules 9004. Each of the signal detector modules 9004 can be configured to determine a particular characteristic of the signal. The detection process of each module starts by multiplexing one of the stored signal samples from 9002 using the multiplexor 9010, which is controlled by the select line 9006. The multiplexed stored sample is then subtracted using a subtractor 9012 from the current signal sample 9008. The result of the subtraction operation is compared using a comparator 9014 against a user specified variance threshold Var_Th 9016. The number of times the variance threshold is satisfied is counted by the counter 9018. The count is then compared using a comparator 9022 against a user specified count threshold Count_Th 9020. If the count exceeds the count threshold, the Detect signal 9024 is set to logic high. The detect signals from each of the signal detector modules 9004 are provided to a logic OR gate 9026. The signal 9028 at the output of the logic OR gate 9026, indicates whether a significant event is detected and whether the DSP that receives the signal should be activated to receive data. In certain embodiments, activating the DSP includes providing a power management control signal to the DSP so as to power off or reduce the power consumption of the DSP.

Parameters that determine what constitutes a significant signal event are set by the end user, by default settings, or autonomously by the DSP through a feedback signal. Such settable parameters include but are not limited to the maximum or minimum amplitude of the signal, the variance of the signal, the frequency content of the signal, the length of samples within a frame to perform detection, particular patterns to correlate the input signal with, and statistics of the signal.

Figure 10:
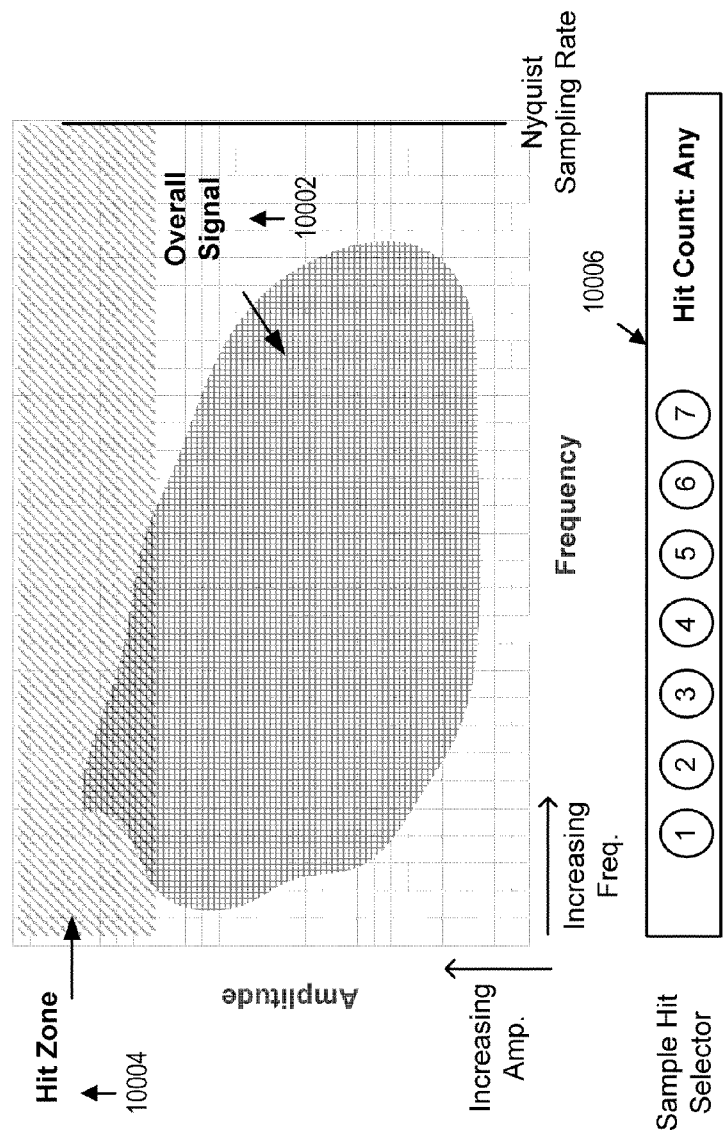
FIG. 10 illustrates an embodiment of a process of applying a threshold to a signal that is mapped to a frequency/amplitude domain in accordance with embodiments of the present disclosure.

FIG. 10 illustrates an embodiment of a process of applying a threshold to a signal that is mapped to a frequency/amplitude domain. The signal's "footprint" over time is illustrated in FIG. 10 as 10002, plotted in the amplitude-frequency projection. When the signal enters the Hit Zone 10004, the ACE ADC identifies a significant event and can activate a microcontroller (MCU), DSP, or combination thereof (MCU/DSP) to analyze the signal further. In certain embodiments, the microcontroller can serve as a host or system controller for the DSP and may be configured to control the operation of the DSP. The Hit Zone 10004 in this example serves as an amplitude threshold that exists at a specific amplitude and is the same at all frequencies.

Figure 11:
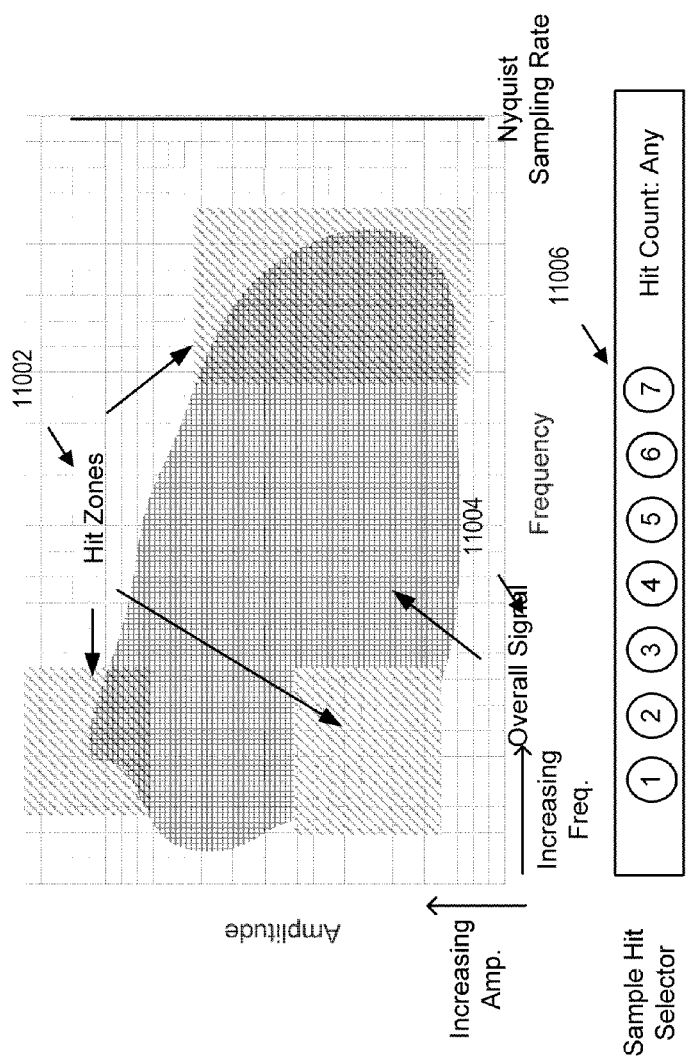
FIG. 11 illustrates another embodiment of a process of applying a threshold to a signal that is mapped to a frequency/amplitude domain in accordance with embodiments of the present disclosure.
Figure 12A:
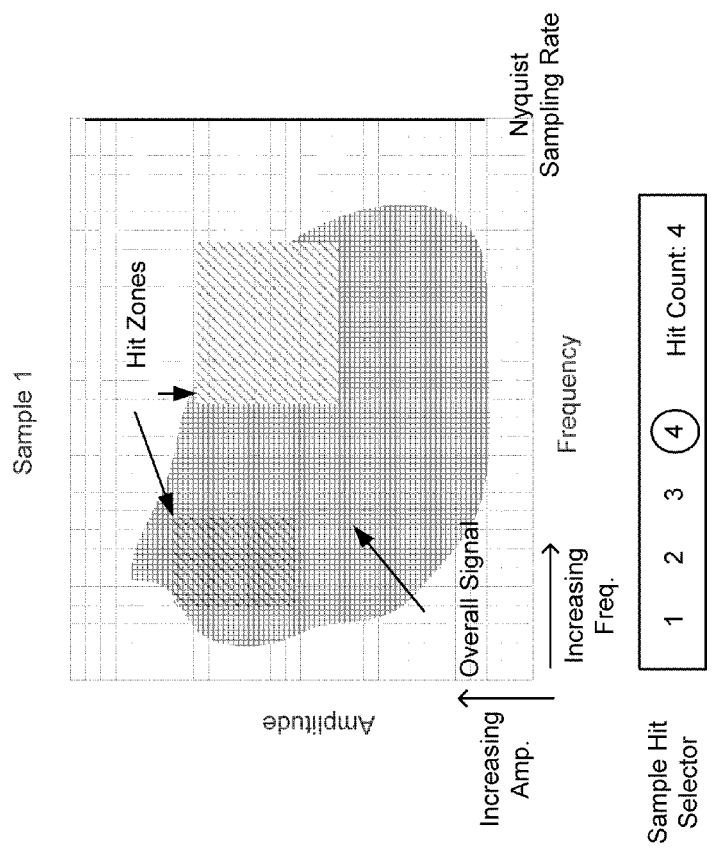
FIGS. 12A-12D illustrate an example of performing pattern detection on a signal using a four-sample window in accordance with embodiments of the present disclosure.
Figure 12B:
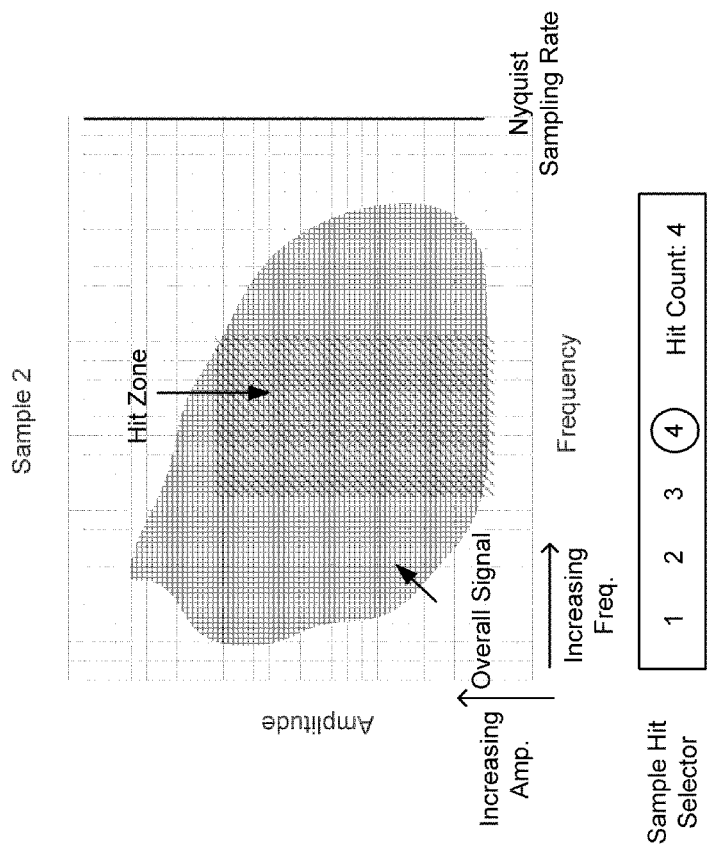
Figure 12C:
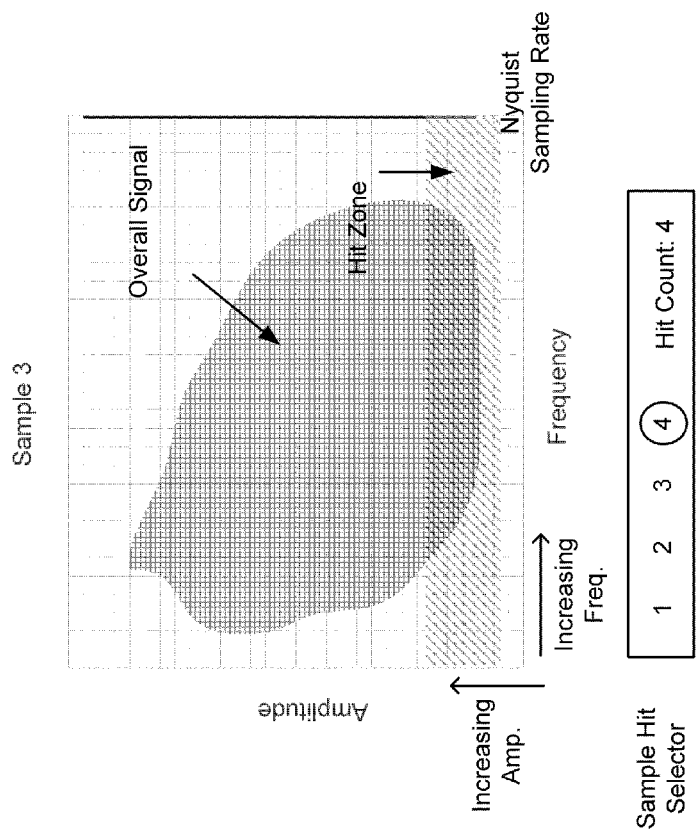
Figure 12D:
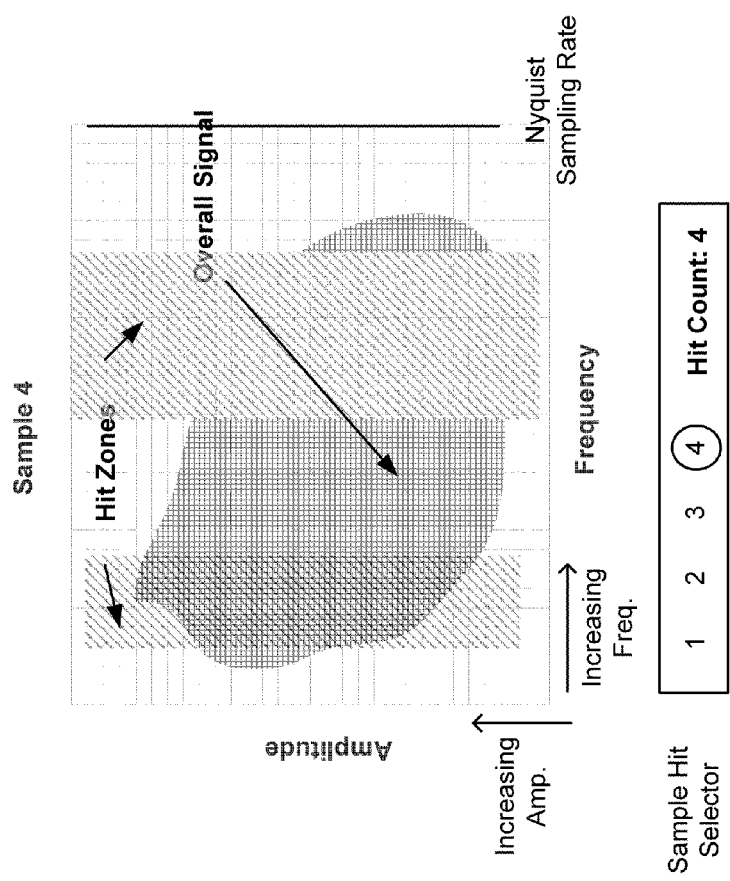

FIG. 11 illustrates another embodiment of a process of applying a threshold to a signal that is mapped to a frequency/amplitude domain. In this embodiment, the Hit Zones 11002 include a combination of amplitude threshold regions and of frequency threshold regions. An ACE, or ACE ADC, can detect when the signal's footprint 11004 enters one of the Hit Zones 11002, which are defined by both frequency and amplitude values. In certain embodiments, the Hit Zones 11002 can be a single contiguous zone. Alternatively, the Hit Zones 11002 can consist of multiple unconnected zones, as illustrated in FIG. 11.

Many prior art systems evaluate signals using Fast Fourier Transform (FFT) analysis. However, this typically involves evaluating the signal over a long period of time. An ACE, or ACE ADC, is configured to evaluate a signal over a substantially shorter window of samples compared to prior art systems. The ACE can then use a probabilistic analysis, based on thresholds, to determine if a signal event of interest exists within a frequency window. If so, the ACE can notify the MCU/DSP and cause it to wake up and perform more computationally intensive calculation compared to the initial threshold based analysis to evaluate the signal over a specific frequency. Thus, in certain embodiments, the ACE can eliminate from analysis windows of samples that do not include frequencies of interest.

FIGS. 10 and 11 also illustrate the evaluation of the signal over time. The bar at the bottom of the figures, the Sample Hit Selector 10006 and 11006 indicate how many samples are evaluated within a time window. In the examples illustrated in FIGS. 10 and 11, seven samples are evaluated for each window as is indicated by the Sample Hit Selector 10006 and 11006. The "Hit Count: Any" status means that if the signal goes into the Trigger Zone (e.g. the Hit Zones 11002) on any of the samples within the window, the MCU/DSP will be activated from a sleep state by the ACE. The Hit Count setting can be set, in this example, to any value between one and seven indicating how many samples from the seven total samples are required to be in the Hit Zones to cause the ACE to activate the MCU/DSP. For example, if the Hit Count is set to three, and the signal enters the Trigger Zone for three or more samples within a window, the ACE will activate the MCU/DSP. If, in this example, the signal does not enter the Trigger Zone at least three times, the ACE will not activate the MCU/DSP from its sleep state. In certain embodiments, the ACE can gauge signal content over time to detect particular patterns within the signal, such as patterns often found in medical signals or dynamic sensor signals, without using computationally intensive correlation and convolution functions. Advantageously, in certain embodiments, reducing the frequency of use of computationally intensive functions to evaluate signals enables the ACE to reduce power consumption compared to systems that do process signals without inclusion of an ACE.

As illustrated in FIGS. 12A-12D, in certain embodiments, the ACE can use different Hit Zones for different samples of a signal within a sample window. FIGS. 12A-12D illustrate an example of performing pattern detection on a signal using a four-sample window. For each sample, the Hit Zone is adjusted based on the type of signal that is to be detected. In the example illustrated in FIGS. 12A-12D, all four samples within the window must be within a Hit Zone for the ACE to activate on the MCU/DSP. FIGS. 12A-12D illustrate an example of how an ACE can be used to replace the evaluation of a correlation function. Advantageously, in certain embodiments, the ACE provides greater flexibility and consumes much less power compared to systems that evaluate the correlation function using prior art methods.

In certain embodiments, the ACE can track the signal over time including tracking the number of instances that the signal enters a Hit Zone and the location within the Hit Zone of the signal. Advantageously, in certain embodiments, the ACE can use the information obtained by tracking the signal to optimize the location of the Hit Zones for later received signals. Further, in certain embodiments, the ACE can optimize power consumption of a system based on the information obtained by tracking the signal over time.

Figure 13:
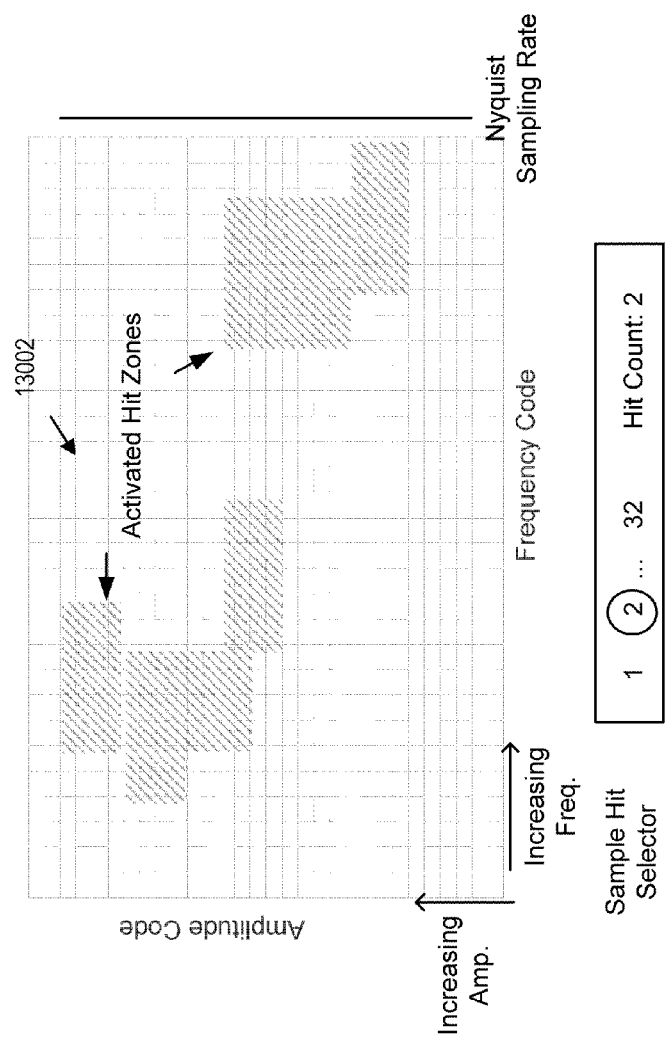
FIG. 13 illustrates one example of an amplitude-frequency map that can be used with an ACE to specify Hit Zones for evaluating a signal in accordance with embodiments of the present disclosure.

FIG. 13 illustrates one example of an amplitude-frequency map that can be used with an ACE to specify Hit Zones for evaluating a signal. The amplitude axis and frequency axis can be divided into an M by N grid. In certain embodiments, a user can specify the regions, or boxes, in the grid to use as Hit Zones 13002 for evaluating a signal. Further, in some implementations, the user can specify the number of samples to evaluate in a window and the number of samples that must enter the Hit Zones 13002 to cause the ACE to activate the MCU/DSP. Advantageously, in certain embodiments, because the user can specify any configuration of boxes to serve as Hit Zones, the ACE is capable of many configurations. Further, in some implementations, the user can program the ACE using a digital interface or any other user interface.

Advantageously, in certain embodiments, the ACE is capable of performing preliminary analysis of signals and activating the MCU/DSP upon detecting a triggering characteristic of the signal (e.g. a particular amplitude, frequency, or pattern).

Another use of ACE is it that can adaptively change the power consumption and performance of a front end system based, at least in part, on an analog signal received by the front end.

A number of phenomena can be represented as signals on a substantially continuous varying analog scale. For example, light, sound, heat and motion can each be represented as analog signals. When processing the analog signals in the analog domain, it is often important to reduce or prevent distortion of the analog signals and the introduction of noise. Too much distortion or noise introduced during processing of the analog signal at the front end can cause a signal to be inaccurately processed by back-end circuitry, such as a digital signal processor, after the signal is converted into the digital domain.

Although not limited as such, the front end generally refers to analog circuitry that may process a received analog signal before it is converted to a digital signal. In contrast, back end circuitry, although not limited as such, may refer to circuitry that processes a signal after is has been converted to a digital signal. In certain embodiments, digital circuitry, or circuitry that processes digital signals, may be included in the front end. Similarly, in certain implementations, the back end circuitry may include analog circuitry, or circuitry that processes analog signals. Examples of analog circuits that can process and manipulate analog signals can include, but are not limited to, amplifiers, filters, mixers, choppers, and integrators, to name a few.

To prevent the loss of data, many analog circuits are biased and designed to operate with the highest magnitude signal amplitude and the highest signal frequency, without regard to how the analog signal may change over time. Consequently, many analog circuits may be configured to operate in a state of maximum power consumption most, if not all, of the time to prevent data loss. Operating at maximum power to accommodate the potential maximum amplitude or frequency of a signal can result in a significant amount of wasted power in a number of environments. For example, applications that use low duty cycle signals (e.g. remote monitoring sensors), burst signals (e.g. ultrasound equipment and surveillance equipment), oversampled signals (e.g. high resolution medical devices), high peak-to-average signals (e.g. acoustic devices), and narrowband signals (e.g. communication devices), may waste significant amounts of power to accommodate analog signals that may, in some cases, rarely, if ever, be at a maximum amplitude or frequency.

Traditional solutions that attempt to adaptively change the power consumption of analog devices are very slow and may take milliseconds or tens to hundreds of microseconds to modify the power consumption. Further, traditional solutions are typically not capable of measuring fast transients that may occur in some signals. Moreover, some traditional solutions that cause severe distortion in the analog signal. In contrast, the ACE can adaptively adjust the bias of the analog devices associated with the front end without distorting the analog signal. Further, the ACE can operate on a sample by sample basis causing a substantial speed increase compared to traditional solutions. For example, in some cases the ACE can adaptively change the power consumption of analog devices in as little as a few microseconds or a few nanoseconds.

In certain implementations, the ACE, can automatically track and adapt based on a received signal regardless of changes to the amplitude, frequency, or pattern of the signal. Although the received signal is generally an analog signal, certain embodiments of the ACE can operate with received digital signals. Further, the ACE can determine characteristics associated with the received signal. For example, the ACE can determine if the signal is substantially constant in amplitude or frequency, or if the signal is substantially constant in amplitude, but varies significantly in frequency. During operation, the ACE can adjust the power consumption of an Analog Front End (AFE) preceding the ACE based on the characteristics of the received signal on a sample-by-sample basis.

In certain embodiments, the ACE oversamples the received signal. Alternatively, an ADC may oversample the signal received from the AFE and provide the sampled and digitized signal to the ACE. By oversampling the signal, the ACE can predict the future trajectory of the analog signal and adjust the power consumption of the AFE accordingly, without reducing signal quality or introducing distortion in the signal. Further, in some cases, the ACE can adjust the power consumption of a sensor associated with the AFE by changing the bias of the sensor based on the received signal.

The ACE may be a stand-alone device or component. Alternatively, the ACE may be built into another component, such as an ADC or a DSP.

In certain embodiments, the ACE may be a mixed signal engine that can interact with analog circuits by adjusting power consumption. The power consumption may be adjusted by modifying one or more of a bias associated with the analog circuits of the AFE, by opening of closing switches associated with different circuits (e.g. different size transistors), and by adjusting time constants associated with the AFE based on fluctuations in the received signal.

In some implementations, the interaction between the ACE and the analog circuits may occur in multiple phases. In the first phase, the ACE adjusts the configuration of the AFE over several samples to optimize power consumption without distorting the received signal. In the second phase, upon identifying the optimal configuration for the AFE, the ACE provides the signal to the ADC for further processing. The ACE may also have a number of programmable parameters that can be set by the user for the target application. For example, these programmable parameters may include: the magnitude of modification to the bias, the transistor sizes, and/or the time constants associated with the AFE, which may determine the granularity of adjustment to the power adjustment of the AFE; the number of samples within each phase for determining how often the AFE power is adjusted; the maximum and/or minimum limit of the power consumption of the AFE, which may be associated with the analog signal quality; the threshold levels associated with determining at what signal level to readjust the AFE's power consumption; and the ability to resort to a default mode. In some cases, the default mode can include biasing the AFE at a maximum power setting.

Figure 14:
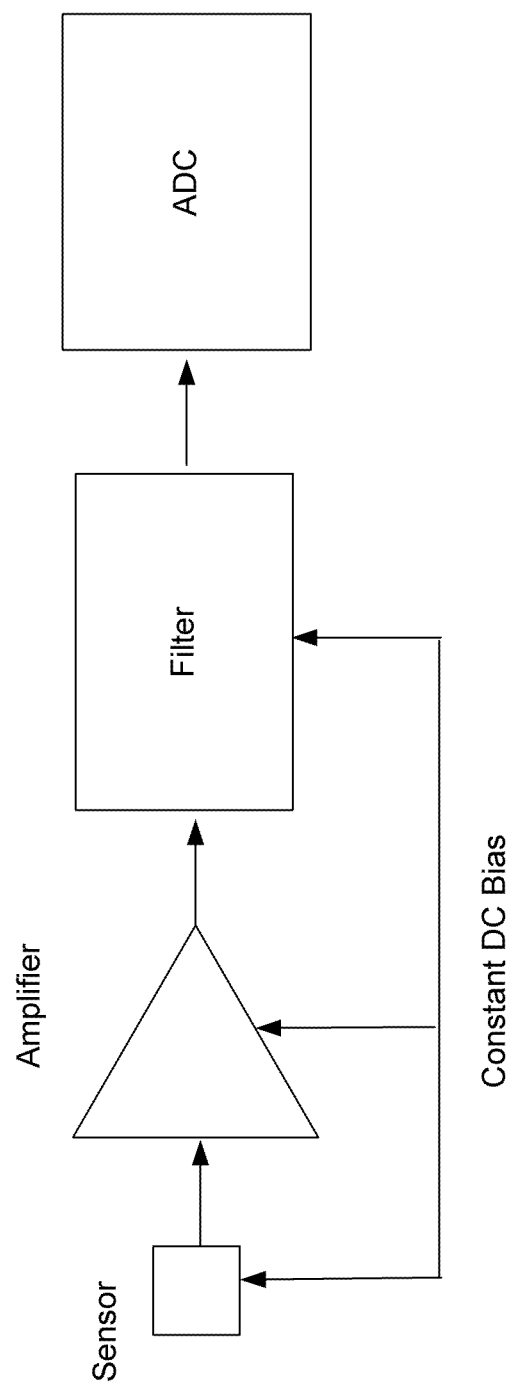
FIG. 14 illustrates an embodiment of an analog front end without an Analog Compression Engine (ACE).

FIG. 14 illustrates an embodiment of an analog front end without an Analog Compression Engine (ACE). The AFE can include any number and type of analog circuits or devices. For example, as illustrated in FIG. 14, the AFE can include a sensor configured to measures an analog signal. The sensor can be connected to an amplifier configured to amplify the signal. In turn, the amplifier may be connected to a filter that is configured to filter the signal. The filtered signal may then be converted to a digital signal by an ADC connected to the filter. As further illustrated in FIG. 14, each of the analog circuits or devices of the AFE may be biased by a constant DC signal. Consequently, the power consumption of the AFE will generally remain constant regardless of how the signal may vary over time. This constant power consumption is typically suboptimal because signals are often not constant.

Figure 15:
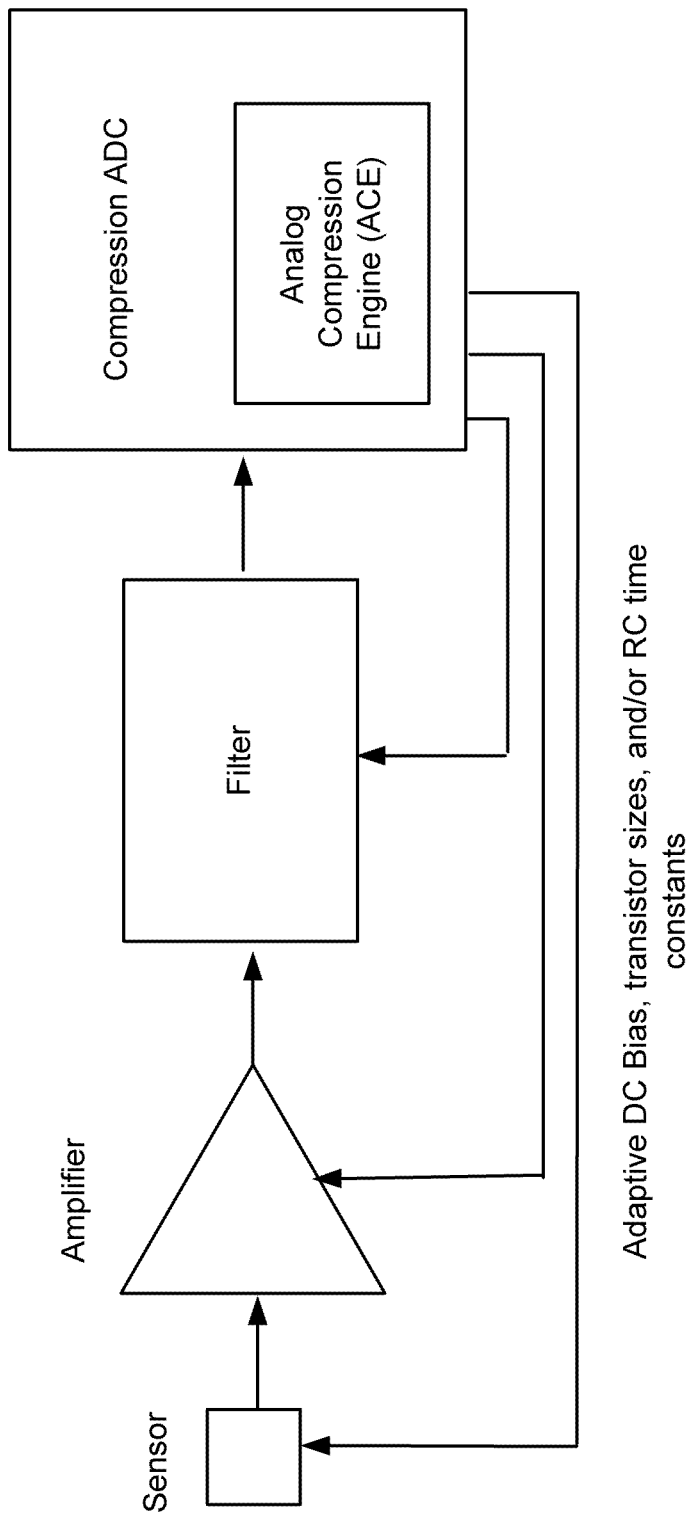
FIG. 15 illustrates an embodiment of an adaptive analog front end with an Analog-to-Digital Convertor (ADC) that includes an embodiment of an ACE in accordance with aspects of the present disclosure.

FIG. 15 illustrates an embodiment of an adaptive analog front end with an Analog-to-Digital Convertor (ADC) that includes an embodiment of an ACE in accordance with aspects of the present disclosure. In certain embodiments, the circuits or devices associated with the AFE may include variable transistor sizes and/or RC time constants. Based on the signal received by the ADC, the ACE may modify one or more of the DC bias, the transistor sizes, and the RC time constants associated with one or more of the analog circuits associated with the AFE. In some implementations, to adjust the transistor sizes and/or RC time constants, the ACE may close or open one or more switches associated with one or more of the analog circuits of the AFE to control which transistors and/or resistor and capacitor combinations are active or in-use by the analog circuits of the AFE. The ability to modify one or more of the DC bias, the transistor sizes, and the RC time constants enables the ACE to modify the power consumption of the AFE. The ACE may modify the power consumption of the AFE based on one or more characteristics of a received signal, which may be analyzed on a sample-by-sample basis. These characteristics can include, for example, the amplitude of the signal, the frequency of the signal, and the historical rate at which the amplitude and/or frequency of the signal varies, to name a few.

Figure 16:
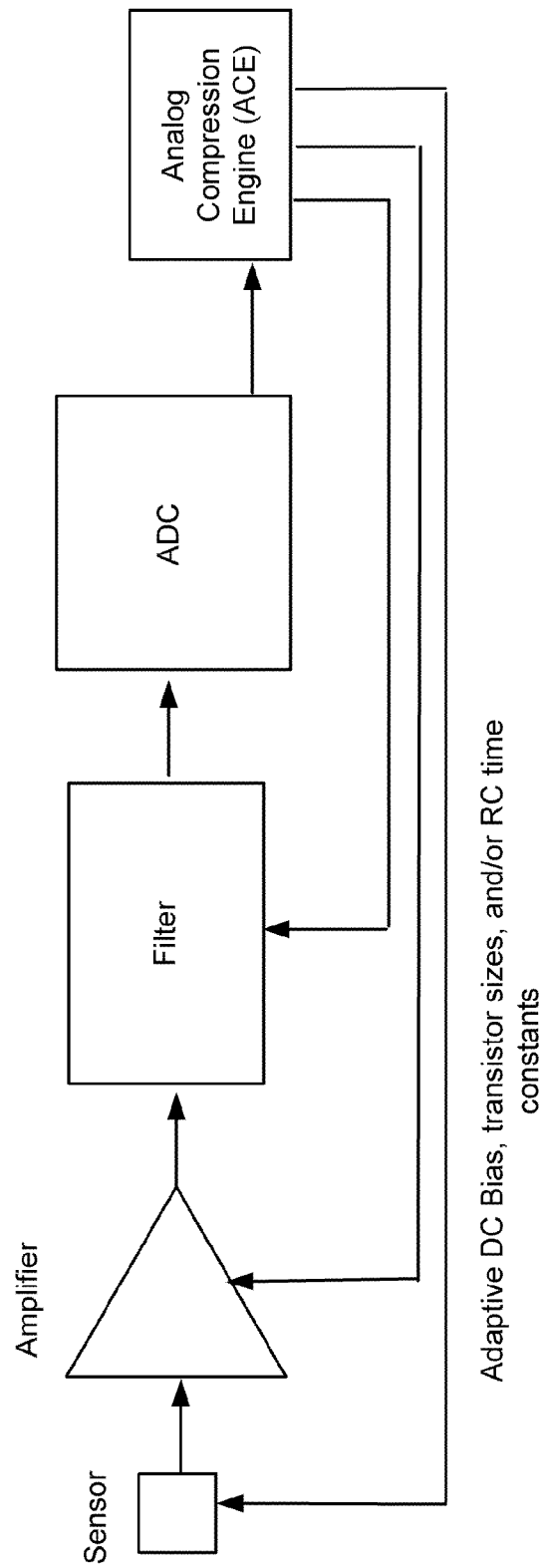
FIG. 16 illustrates an embodiment of an adaptive analog front end that includes an embodiment of a stand-alone ACE in accordance with aspects of the present disclosure.

FIG. 16 illustrates an embodiment of an adaptive analog front end that includes an embodiment of a stand-alone ACE in accordance with aspects of the present disclosure. Although FIG. 16 illustrates the ACE as receiving the digitized signal from the ADC, in some embodiments, the ACE may receive a non-digitized signal. In such cases, the ACE may be located before the ADC. In some cases, the ACE may receive the analog signal before the signal is provided to one or more of the analog circuits. The ACE may then provide the signal to the analog circuits. For example, the ACE may receive the signal after it has been amplified by the amplifier, but before it is provided to the filter of FIG. 16. In some implementations, the analog circuits and the ACE may receive the signal substantially in parallel.

Figure 17:
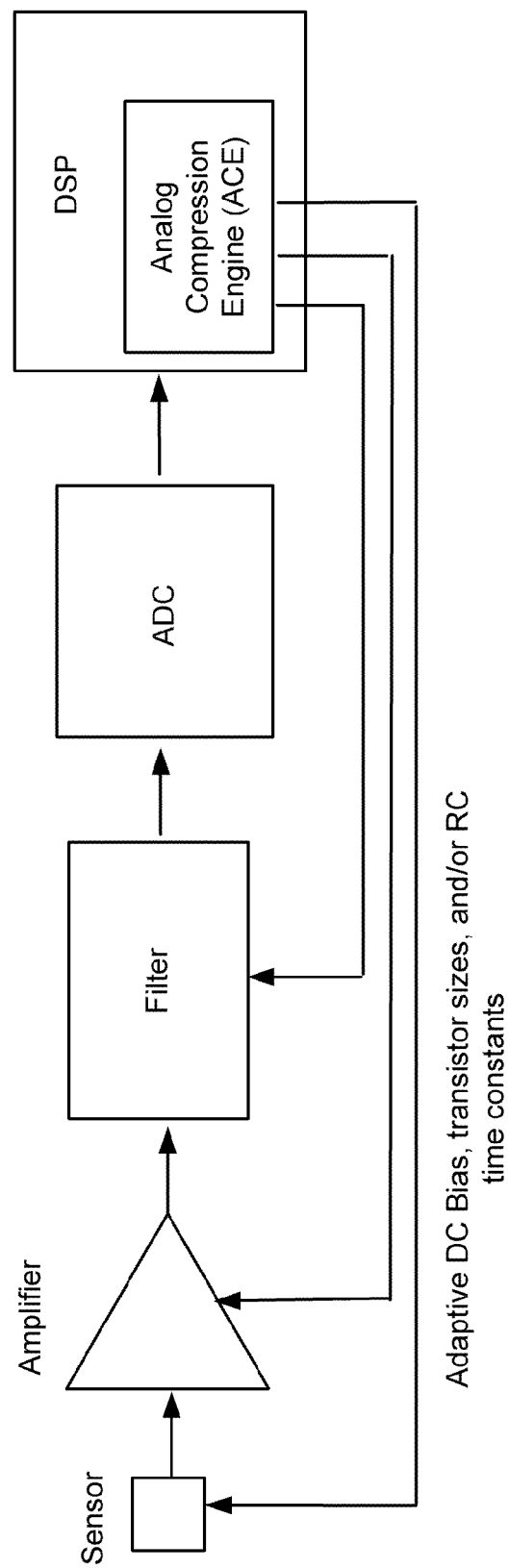
FIG. 17 illustrates an embodiment of an adaptive analog front end with a Digital Signal Processor (DSP) that includes an embodiment of an ACE in accordance with aspects of the present disclosure.

In some embodiments, the ACE can be included as part of a digital component. For example, FIG. 17 illustrates an embodiment of an adaptive analog front end with a Digital Signal Processor (DSP) that includes an embodiment of an ACE in accordance with aspects of the present disclosure. The ACE can be included with any type of digital component that can be configured, at least in part, to adjust one or more of the DC bias, transistor size or RC time constant for one or more analog devices associated with an analog front-end.

Figure 18:
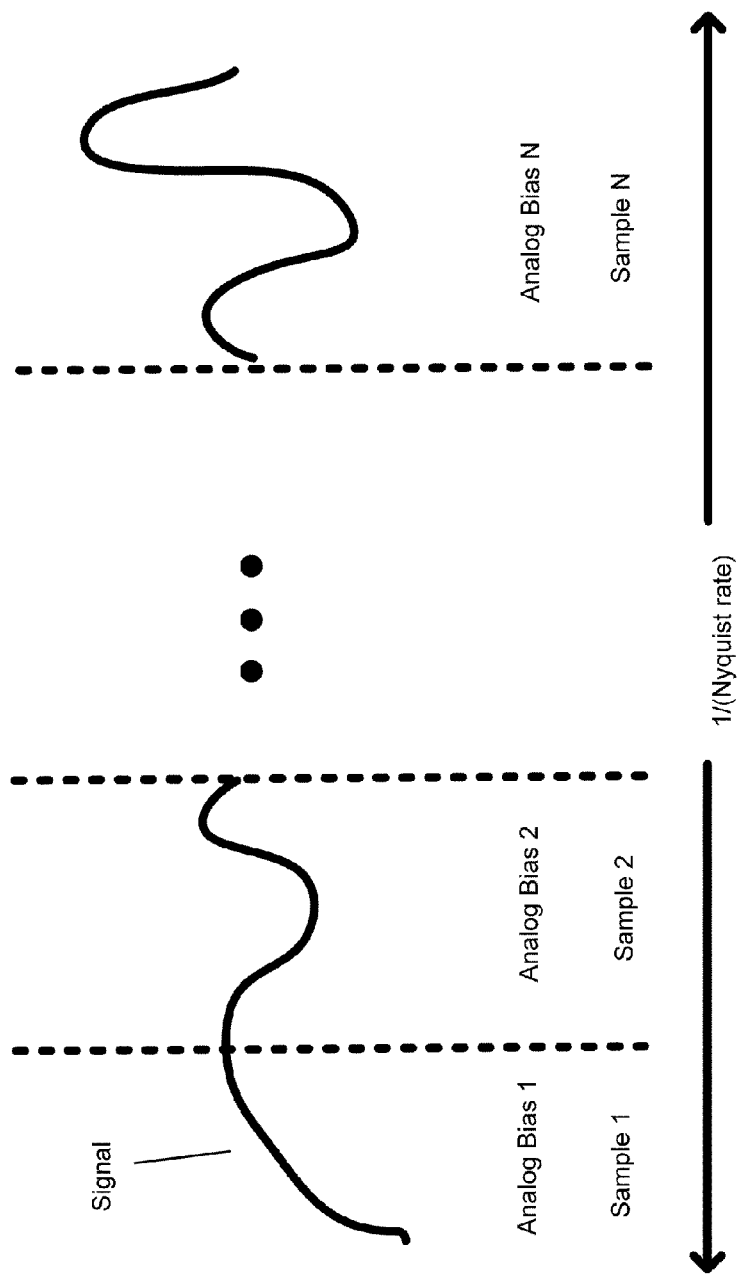
FIG. 18 illustrates an example of biasing an analog circuit based on a substantially varying signal in accordance with aspects of the present disclosure.

To prevent the loss of information associated with the received signal, in certain embodiments, the ADC oversamples the analog signal before providing the sampled signal to the ACE. This oversampled signal may be used, at least in part, to adjust characteristics of the AFE, such as the DC bias associated with one or more analog circuits associated with the AFE. Oversampling generally refers to sampling a signal at a rate greater than the Nyquist rate. In some cases, oversampling may include sampling the signal at a rate that is a multiple of the Nyquist rate. FIG. 18 illustrates an example of biasing an analog circuit based on a substantially varying signal in accordance with aspects of the present disclosure. In the example illustrated in FIG. 18, the signal is N-times oversampled. In some embodiments, the signal is oversampled per frame. Alternatively, the signal is oversampled per time period T, which may be selected based on one or more of the application, the signal frequency, or any other signal characteristics associated with the signal.

During each sample of the oversampled frame, if the signal amplitude, frequency, or patterned rate satisfies a threshold, one or more of the DC bias, the transistor size, and the RC time constant associated with the analog circuits of the AFE are modified. For example, the DC bias may be increased. In certain embodiments, the threshold may be modified for each sample based on the result of the comparison for the previous sample. For example, if the signal amplitude of a first sample satisfies a threshold, the amplitude threshold may be increased for the next sample. Alternatively, if the signal amplitude does not satisfy the threshold, the amplitude threshold may be decreased. In some implementations, multiple thresholds may exist. Thus, the ACE may determine that the amplitude of the signal sample satisfies a first threshold, but not a second threshold. The ACE may then modify the AFE accordingly. For example, the ACE may select a smaller or larger transistor based on the signal sample satisfying the first threshold, but not the second threshold. Assuming the ACE is configured to adjust the DC bias of the AFE, for the example illustrated in FIG. 18, the DC bias will be set progressively higher because the signal as illustrated in FIG. 18 continues increasing. In the last frame, the DC bias is set to the highest power, which will provide the highest quality signal and the greatest bandwidth equaling that of a traditional constant bias system. In some embodiments, the sampled signal of the last frame may then be provided to circuits subsequent of the ACE, which are generally digital circuits, but are not limited as such. The previous samples that were used to determine, at least in part, adjustments to the analog circuits of the AFE may be discarded. The process may then be repeated for the next frame.

Figure 19:
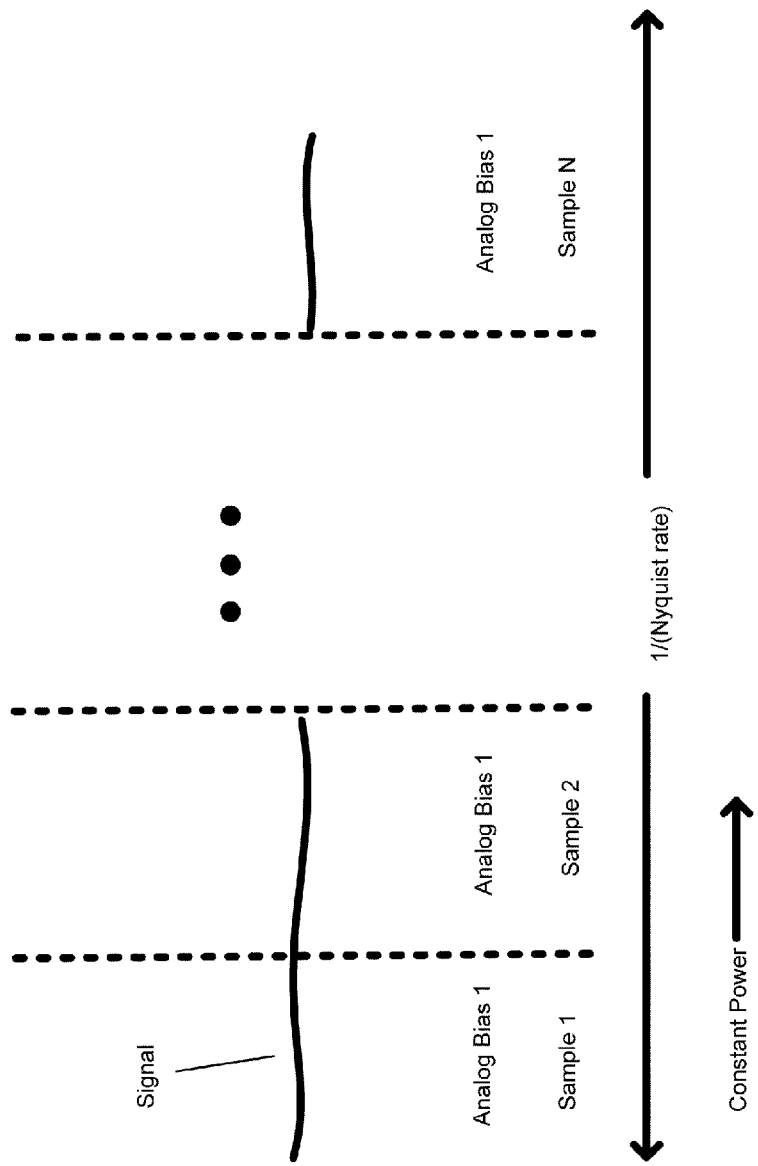
FIG. 19 illustrates an example of biasing an analog circuit based on a substantially constant signal in accordance with aspects of the present disclosure.

FIG. 19 illustrates an example of biasing an analog circuit based on a substantially constant signal in accordance with aspects of the present disclosure. As with the example of FIG. 18, each frame of the signal illustrated in FIG. 19 is N-times oversampled. As the signal illustrated in FIG. 19 is substantially constant and associated with a relatively low amplitude and/or frequency, the ACE can maintain the analog bias of the AFE at a substantially constant and low value. Consequently, the AFE consumes relatively low power compared to when the AFE processes the signal illustrated in FIG. 18. As with FIG. 18, the ACE can provide the last sample from the frame to subsequent circuits in the chain of circuits processing the signal, and repeat the process with the next frame.

Figure 20:
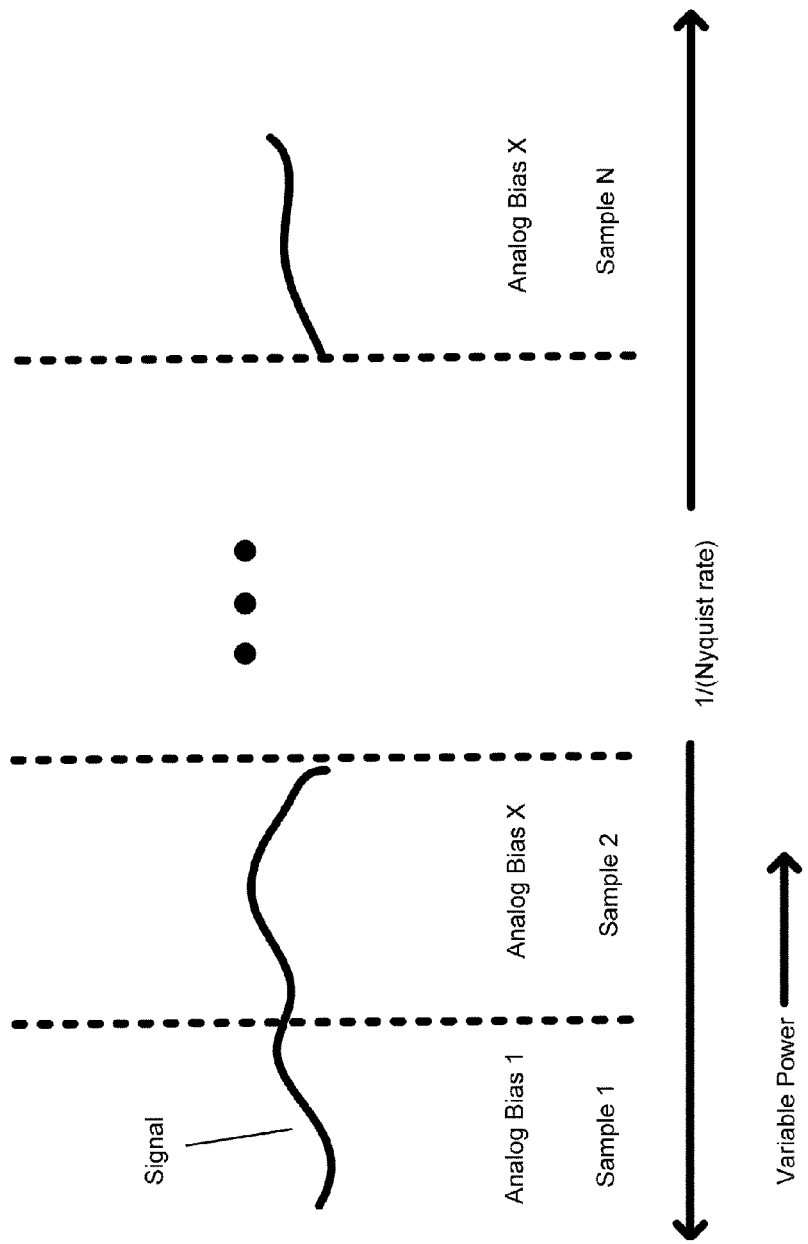
FIG. 20 illustrates an example of biasing an analog circuit based on a signal with a level of variance between the examples illustrated in FIGS. 5 and 6 in accordance with aspects of the present disclosure.

FIG. 20 illustrates an example of biasing an analog circuit based on a signal with a level of variance between the examples illustrated in FIGS. 18 and 19 in accordance with aspects of the present disclosure. During each oversampled frame, the signal may or may not satisfy a threshold associated with an amplitude or frequency, thus, the DC or analog bias settings may be set to different values for each sample to determine the setting that will optimize the power consumption of the analog circuits without distorting the signal. As with the examples of FIGS. 18 and 19, during the last sample of the frame, the DC bias will be set to a value that reduces power consumption without distorting the signal, and the last sample can be provided to subsequent circuits in the system. The process can then be repeated with the next frame. In some implementations, the previous samples may be discarded. Alternatively, at least some of the previous samples, for each frame, may be provided to circuits subsequent to the ACE in the signal chain. Further, in some cases, the previous samples may be averaged or decimated to improve the resolution of the signal compared to an analog system without the ACE and oversampling.

Figure 21:
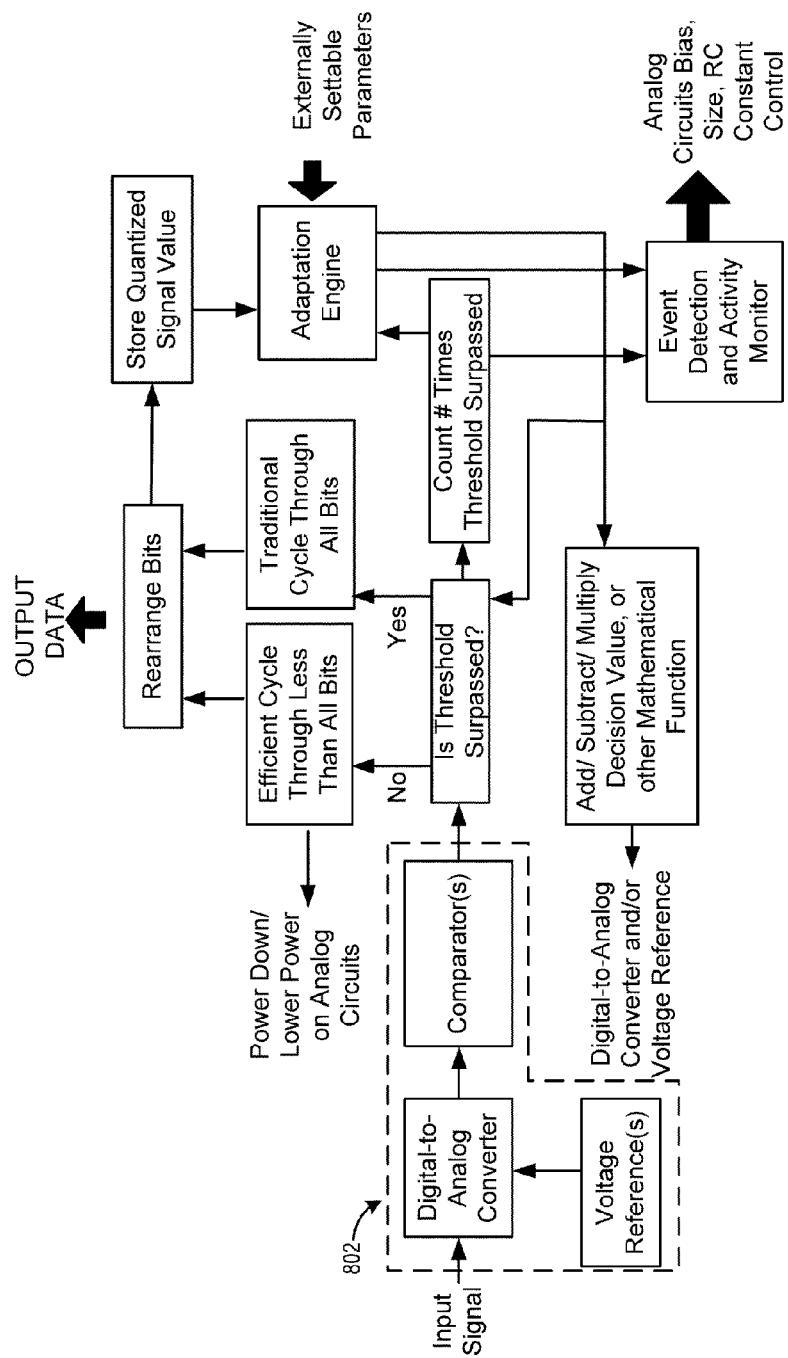
FIG. 21 illustrates an embodiment of the operation of an ACE in communication with an ADC in accordance with aspects of the present disclosure.

FIG. 21 illustrates an embodiment of the operation of an ACE in communication with an ADC in accordance with aspects of the present disclosure. The ADC may include a digital-to-analog converter (DAC), one or more comparators and one or more voltage reference sources. A preset value may be added, subtracted, multiplied, or used to mathematically manipulate a sampled input signal received at the DAC. In certain embodiments, the DAC may use one or more voltage references to facilitate operation. The output of the DAC may then be applied to one or more comparators. The output of the comparator identify whether the mathematically manipulated sampled signal is above or below a decision threshold. If the decision is below the threshold, then bits of the signal have already been predetermined, and determining the remaining bit values requires less power consumption than determining all the bit values of the signal using other methods and/or systems. Thus, the combination of the ACE and the ADC increases power efficiency while maintaining the true quantized value of the sampled signal. If the decision is above the threshold, then the arithmetic manipulation on the sampled signal is undone. Afterwards, the sampled signal may be processed using a maximum or power setting or bias to determine each bit value. Thus, the sampled signal can be processed to obtain the same signal quality as an ADC without an ACE when the signal is difficult predict.

In some embodiments, the ACE can count or keep track of the number of times a threshold associated with the signal (e.g. a signal amplitude threshold) is satisfied or exceeded within a time frame. Based, at least in part, on the number of times the threshold is satisfied and/or the previously determined values of the quantized signal, the ACE decides on what arithmetic addition, subtraction, multiplication, or other mathematical function to perform on the next sampled signal. The ACE may also determine the threshold value to compare the signal against. Thus, the ACE can control the mathematical manipulation on the sampled input signal adaptively through time to maximize the chance of performing efficient partial bit quantization. Other parameters may be used for controlling the ACE. These parameters may include, for example: the number of counts to take into account, the time frame to record, the samples to consider, and the threshold limits. Once the signal has been processed, it may be provided to the DSP.

The ACE may calculate a decision, based on the number of times the threshold is exceeded, the threshold value, and the user-set parameters, to determine the activity level of the signal and whether a significant event in the signal has occurred. The ACE, based on whether an event has been detected, and the level of activity monitored, drives the bias, transistor size selection, and/or RC time constant control lines for the AFE circuits. Upon each successive sample within the oversampling frame, the ACE may either increase, decrease, or takes no action in relation to the power consumption of the AFE circuits, based on the activity detected by the ACE.

Figure 22:
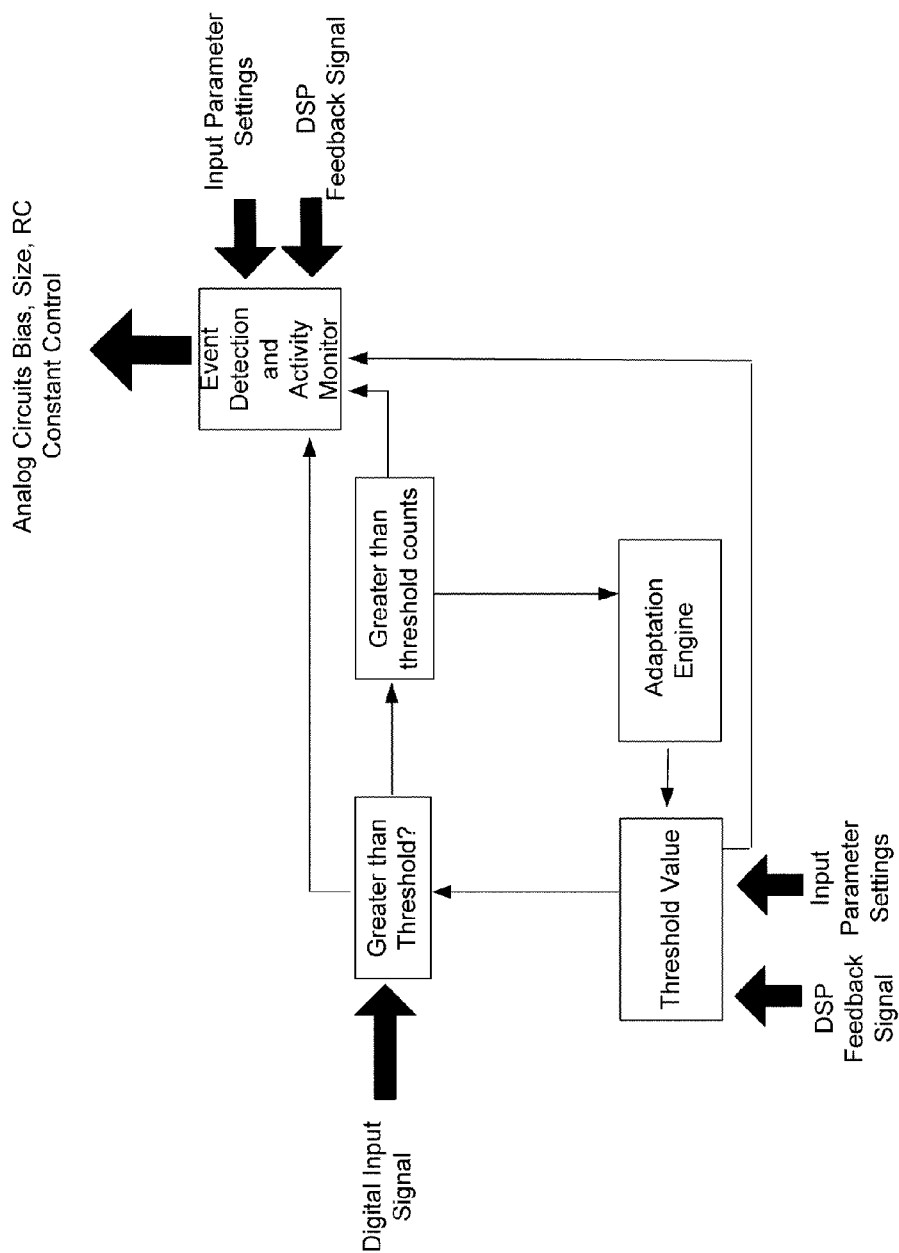
FIG. 22 illustrates an embodiment of the operation of a stand-alone ACE or as an ACE included by a DSP in accordance with aspects of the present disclosure.

FIG. 22 illustrates an embodiment of the operation of a stand-alone ACE or as an ACE included by a DSP in accordance with aspects of the present disclosure. FIG. 22 shows the implementation of ACE built as a separate entity or integrated into the DSP, as conceptually discussed in FIG. 16 and FIG. 17. The input signal is first compared against a threshold value, either in magnitude, variance, frequency or a certain pattern. The number of times the threshold is exceeded within a certain time frame is counted, and passed on an adaptation engine which makes a recommendation on how the threshold value should be changed to in the next time frame. The threshold value, based on the recommendation from the adaptation engine, input parameters, and/or a DSP feedback signal, if used, is either increased, decreased or stays the same the next time frame. Based on whether the input digital signal exceeds the threshold, the number of times the threshold is exceeded over a certain time frame, input parameters, and/or a DSP feedback signal, the ACE gauges whether the input signal has sufficient activity happening. The ACE then drives the bias, transistor size selection, and/or RC time constant control lines for the AFE circuits according to the signal activity taking place, thereby making a decision on the control values every oversampling interval.

Figure 23:
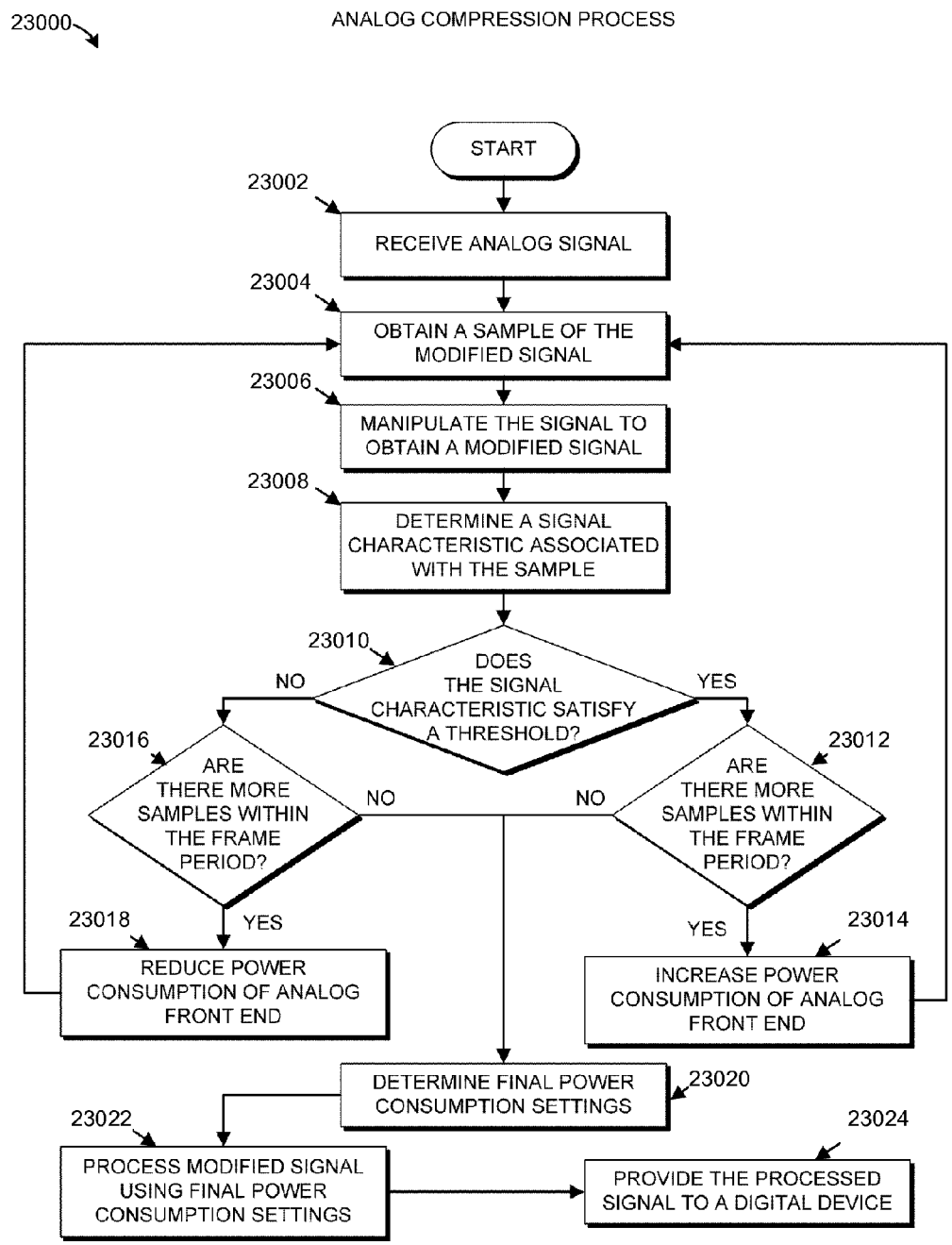
FIG. 23 presents a flowchart for an embodiment of an analog compression process in accordance with aspects of the present disclosure.

FIG. 23 presents a flowchart for an embodiment of an analog compression process 23000 in accordance with aspects of the present disclosure. The process 23000 can be implemented by any system that can perform analog compression. For example, the process 23000 can be implemented by the ACE illustrated in FIGS. 15-17. Although any number of systems, in whole or in part, can implement the process 23000, to simplify discussion, the process 23000 will be described as being generally implemented by an ACE.

The process 23000 begins at block 23002 where, for example, the ACE of FIG. 15 receives an analog signal. At block 23004, the ACE obtains a sample of the modified signal for a frame period T. In some implementations, the sampling may be performed by an ADC. The ADC may receive the signal from, for example, a signal source or an analog circuit or device. The ADC may then convert the signal to a digital form and provide the digital signal, or a sample from the digital signal, to the ACE. For some embodiments, the ACE may be part of the ADC. Alternatively, the ACE may be included with a DSP or other digital component. The ADC may provide the sample of the modified signal to the DSP, which can provide the sample to the ACE. As another alternative, the ACE may be a standalone component that receives the sample from the ADC directly, or indirectly. For some implementations, the ADC may sample the modified signal at a resolution that is lower than full resolution. For example, if the resolution of the ADC is 16-bits, the ADC may sample and digitize the modified signal at 8-bits resolution. Alternatively, the ADC may sample and digitize the modified signal at the full resolution of which the ADC is capable.

The ACE manipulates the signal at block 23006 to obtain a modified signal. Manipulating the signal can include any process for modifying a signal and/or for focusing on particular segments or characteristics of the signal. For example, manipulating the signal can include performing any type of mathematical operation on the signal including adding, subtracting, or multiplying the signal by a value or by another signal. Generally, the mathematical operation may be application specific. In some embodiments, one or more of blocks 23002 and 23004 may be optional.

The ACE, at block 23008, determines a signal characteristic associated with the signal sample. In some cases, the ACE may determine multiple signal characteristics based on the signal sample. These signal characteristics can include any type of signal characteristics that can be used as a basis for compressing the analog signal or modifying the power consumption of one or more analog devices, circuits, or components associated with a system that includes at least one analog device, circuit, or component. For example, the signal characteristics can include the amplitude, frequency, phase of a signal, or a rate of change of the amplitude, frequency, or phase of a signal, to name a few.

At decision block 23010, the ACE determines whether the signal characteristic satisfies a threshold. In some implementations, the threshold is application specific. For some embodiments, decision block 23010 may include determining whether one or more signal characteristics satisfy one or more of a plurality of thresholds. For example, there may be one threshold associated with a signal's amplitude and there may be three thresholds associated with a signal's frequency.

If the ACE determines at decision block 23010 that the signal characteristic satisfies the threshold, it is likely that the signal will not be processed correctly by the analog circuits of the AFE at the current power settings of the analog circuits. At decision block 23012, the ACE determines if there are more samples to process within the frame period. If so, the ACE may increase the power consumption of the AFE, or the analog circuits associated with the AFE, at the block 23014 and the ACE returns to block 23004. Increasing the power consumption of the AFE can include increasing the DC bias. Further, in some embodiments, increasing the power consumption can include selecting different size transistors or modifying the RC time constant of one or more analog circuits associated with the AFE. In some implementations, the amount that the power to the AFE is increased is application specific. Further, the amount that the power is increased may be based on how close the signal characteristic is to satisfying the threshold. Moreover, in implementations that include multiple thresholds, the amount that the power is increased may depend on which threshold or thresholds are satisfied. In some embodiments, the ACE may undo the manipulations to the modified signal at block 23014 to obtain the original signal. The ACE may then continue process 23000 using the original signal, or may re-manipulate the signal using different settings.

If the ACE determines at decision block 23010 that the signal characteristic does not satisfy the threshold, it is possible that more power is being expended by the AFE than is necessary. At decision block 23016, the ACE determines if there are more samples to process within the frame period. If so, the ACE may reduce the power consumption of the AFE, or the analog circuits associated with the AFE, at the block 23018 and the ACE returns to block 23004. Decreasing the power consumption of the AFE can include decreasing the DC bias. Further, in some embodiments, decreasing the power consumption can include selecting different size transistors or modifying the RC time constant of one or more analog circuits associated with the AFE. In some implementations, the amount that the power to the AFE is decreased is application specific. Further, the amount that the power is decreased may be based on how close the signal characteristic is to satisfying the threshold. Moreover, in implementations that include multiple thresholds, the amount that the power is decreased may depend on which threshold or thresholds are not satisfied. For example, if a lower threshold is satisfied, but a higher threshold is not satisfied, the power may be decreased less, if at all, than if both the lower and higher thresholds are not satisfied. In some embodiments, the ACE may undo the manipulations to the modified signal at block 23018 to obtain the original signal. The ACE may then continue process 23000 using the original signal, or may re-manipulate the signal using different settings.

In some embodiments, the ACE may modify one or more of the thresholds used at decision block 23010 as part of the operation associated with one or more of the blocks 23014 and 23018. Further, in some embodiments, the ACE may add additional thresholds for use at decision block 23010 at one or more of the blocks 23014 and 23018. Advantageously, in certain embodiments, by adding or modifying thresholds, the ACE may more finely determine the power settings for the AFE that enable power savings without distorting the signal or introducing noise. In some cases, the ACE may remove thresholds used at decision block 23010 as part of block 23014 and/or 23018. In some cases, the ACE may modify the sampling rate at one or more of blocks 23014 and 23018 based on one or more signal characteristics and/or the determination at decision block 23010.

If at either decision block 23012 or decision block 23016 the ACE determines that there are no more samples within the frame period, the ACE determines at block 23020 the final power consumption settings for the AFE, or one or more analog devices or components associated with the AFE. The final power consumption settings may be based on the power consumption settings when the final sample is processed for a time period T. Alternatively, the final power consumption settings may be based on the power consumption settings for each sample or a subset of the samples that was processed over the time period T. In some cases, the final power consumption settings may be based on one or more of the determination at block 23010, the power consumption increases of block 23014, and the power consumption reductions of block 23018. Determining the power consumption settings may be application specific. In addition, if the ACE is unable to determine a reduced power consumption setting to process the modified signal, the ACE may use the maximum power that the AFE is designed to use as the final power consumption setting. In some cases, the final power consumption settings may equal the initial power consumption settings, which may or may not be equal to full power. For example, the initial power consumption settings may be the final power consumption settings resulting from processing the signal over a previous time period T.

At block 23022, the ACE processes the modified signal using the final power consumption settings determined at block 23020 for the AFE, or one or more analog circuits or devices associated with the AFE. In some embodiments, the ACE processes the final sample of the signal over a time period T and discards all previous samples at block 23022. Alternatively, the ACE may process the entire signal using the final power consumption settings.

At block 23024, the ACE provides the processed and digitized signal to a digital device or any other device that may perform further processing of the processed signal.

TERMINOLOGY

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of performing signal compression based analog-to-digital conversion and event detection, comprising:
   sampling an analog input signal;
   a means to modify the sampled input signal;
   comparing the sampled signal against an adaptive threshold;
   a technique to provide power efficient digitization of the sampled input signal that skips already known bits;
   a technique to undo modification on the samples signal and use conventional digitization of the sampled input signal, cycling through all bits of the signal;
   an Analog Compression Engine (ACE), wherein the ACE is configured to determine whether the sampled signal is above or below set amplitude, frequency, and patterned adaptive thresholds, and also adaptively manipulates the sampled signal mathematically through the DACs and/or voltage reference(s) of the quantizer core;
   an Event Detection Engine which has the ability run more complex tests on the signal to determine whether a significant event is present;
   monitoring the activity level an detecting events of the input analog signal and inform subsequent building blocks, including but not limited to a digital signal processor;
   controlling, interrupting, and selecting power modes of the subsequent blocks based on the signal event and information.

2. A method as claimed in claim 1, where in the Event Detection Engine has the option to run additional tests on the signal to determine the presence of a significant event.

3. A method as claimed in claim 2, wherein the significant event is defined in terms, but not limited to, the signal amplitude, variance, frequency, patterns and statistics.

4. A method as claimed in claim 2, wherein a defined previous signal sample is subtracted against the current signal sample and the result is compared against an adaptive variance threshold.

5. A method as claimed in claim 2, wherein the number of times the variance threshold is satisfied is counted, and if the count number satisfies a count threshold, a significant event is detected and the subsequent DSP is powered on with data transferred to it.

6. A method as claimed in claim 2, wherein if the count threshold is not satisfied, there is either the option to redefine the signal characteristics considered as significant events, or the option to consider an significant event as not present and the subsequent DSP is powered down and data is discarded.

7. A method as claimed in claim 1, wherein the user customizes the events to be detected by selected zones in the amplitude-frequency-time mapping.

8. A method as claimed in claim 7, wherein the user selected hit zone is divided into M amplitude intervals, N frequency intervals, and O time samples.

9. A method as claimed in claim 7, the amplitude-frequency hit zones can be varied adaptively on each sample.

10. A method as claimed in claim 1, where statistics on the signal can be gathered over time to make future decisions.

11. A method as claimed in claim 3, wherein the detection of the frequency content of the signal is done based on the rate of change of the signal, rather than a computationally intensive Fast Fourier Transform, or other domain transforms.

12. A system for adaptively biasing analog front end circuits according to an input analog signal, the system comprising:
- one or more of a sensor, an amplifier, and a filter;
- analog circuits in an analog front end that process an analog signal, the analog circuits comprising a means for variable bias;
- an analog-to-digital converter that oversamples and digitizes the output of the analog front end;
- an analog compression engine, associated with the analog-to-digital converter, that determines activity presence in the analog signal and adaptively controls one or more of the bias, transistor size selection, and/or RC time constant of the analog front end on one or more samples within an oversampling time frame,
- wherein the analog compression engine is further configured to compute the level of activity of the signal based on the number of conventional full bit quantization counts and the threshold value.

13. The system of claim 12, wherein the analog compression engine is built into the analog-to-digital converter.

14. The system of claim 12, wherein the analog compression engine is further configured to monitor the activity of the input signal.

15. The system of claim 12, wherein based on the information and decisions provided by the activity monitoring and event detector, the control to the biases, transistor size selection, and/or RC time constant of the analog front end are adjusted or kept the same on every sample within an oversampling time frame.

16. The system of claim 12, wherein the last sample of an oversampling time frame is kept and sent on to subsequent building blocks, and other samples are discarded.

17. The system of claim 12, wherein all or some of the samples within an oversampling time frame are kept and sent to subsequent building blocks, and can be averaged, filtered, and/or decimated to provide an overall improvement is signal resolution.

18. The system of claim 12, wherein the analog compression engine exists as a separate entity or is built into a digital signal processor.

* * * * *